(12) United States Patent
Jurczyk et al.

(10) Patent No.: US 11,560,627 B2
(45) Date of Patent: Jan. 24, 2023

(54) ATMOSPHERIC COLD PLASMA JET COATING AND SURFACE TREATMENT

(71) Applicant: STARFIRE INDUSTRIES LLC, Champaign, IL (US)

(72) Inventors: Brian Edward Jurczyk, Champaign, IL (US); Robert Andrew Stubbers, Savoy, IL (US)

(73) Assignee: STARFIRE INDUSTRIES LLC, Champaign, IL (US)

( * ) Notice: Subject to any disclaimer, the term of this patent is extended or adjusted under 35 U.S.C. 154(b) by 780 days.

(21) Appl. No.: 15/987,273

(22) Filed: May 23, 2018

(65) Prior Publication Data

US 2018/0342379 A1 Nov. 29, 2018

Related U.S. Application Data

(60) Provisional application No. 62/510,068, filed on May 23, 2017.

(51) Int. Cl.
*C23C 16/511* (2006.01)
*C23C 16/455* (2006.01)
(Continued)

(52) U.S. Cl.
CPC .......... *C23C 16/511* (2013.01); *C23C 14/021* (2013.01); *C23C 16/0227* (2013.01);
(Continued)

(58) Field of Classification Search
None
See application file for complete search history.

(56) References Cited

U.S. PATENT DOCUMENTS

| | | | |
|---|---|---|---|
| 5,179,264 A | 1/1993 | Cuomo et al. | |
| 5,556,558 A * | 9/1996 | Ross | H05H 1/44 |
| | | | 219/121.5 |

(Continued)

OTHER PUBLICATIONS

International Searching Authority/US, International Search Report and Written Opinion in corresponding International Application No. PCT/US2018/034166, dated Jul. 31, 2018 (16 pages).

*Primary Examiner* — Ram N Kackar
(74) *Attorney, Agent, or Firm* — Leydig, Voit & Mayer, Ltd.

(57) ABSTRACT

A system and method are described for depositing a material onto a receiving surface, where the material is formed by use of a plasma to modify a source material in-transit to the receiving surface. The system comprises a microwave generator electronics stage. The system further includes a microwave applicator stage including a cavity resonator structure. The cavity resonator structure includes an outer conductor, an inner conductor, and a resonator cavity interposed between the outer conductor and the inner conductor. The system also includes a multi-component flow assembly including a laminar flow nozzle providing a shield gas, a zonal flow nozzle providing a functional process gas, and a source material flow nozzle configured to deliver the source material. The source material flow nozzle and zonal flow nozzle facilitate a reaction between the source material and the functional process gas within a plasma region.

19 Claims, 24 Drawing Sheets

(51) Int. Cl.
*C23C 16/513* (2006.01)
*C23C 16/02* (2006.01)
*H01J 37/32* (2006.01)
*C23C 16/515* (2006.01)
*C23C 14/02* (2006.01)
*C23C 14/34* (2006.01)
*H01J 37/34* (2006.01)

(52) U.S. Cl.
CPC .... *C23C 16/4551* (2013.01); *C23C 16/45576* (2013.01); *C23C 16/45595* (2013.01); *C23C 16/513* (2013.01); *C23C 16/515* (2013.01); *H01J 37/32192* (2013.01); *H01J 37/32201* (2013.01); *H01J 37/32247* (2013.01); *H01J 37/32449* (2013.01); *C23C 14/34* (2013.01); *H01J 37/3444* (2013.01); *H01J 37/3467* (2013.01); *H01J 2237/332* (2013.01)

(56) References Cited

U.S. PATENT DOCUMENTS

| | | | |
|---|---|---|---|
| 6,013,155 A | 1/2000 | McMillin et al. | |
| 6,148,764 A * | 11/2000 | Cui | C23C 16/345 118/723 ME |
| 2001/0022295 A1 * | 9/2001 | Hwang | C23C 16/513 219/121.47 |
| 2004/0026234 A1 | 2/2004 | Vanden Brande et al. | |
| 2004/0173316 A1 | 9/2004 | Carr | |
| 2005/0257570 A1 | 11/2005 | Schmidt et al. | |
| 2009/0127101 A1 * | 5/2009 | Nauman | C23C 14/54 204/192.26 |
| 2009/0218211 A1 | 9/2009 | Yang et al. | |
| 2009/0304924 A1 * | 12/2009 | Gadgil | C23C 16/45551 427/255.5 |
| 2010/0130973 A1 | 5/2010 | Choi et al. | |
| 2010/0178435 A1 * | 7/2010 | Ervin | C23C 16/56 427/569 |
| 2010/0215541 A1 | 8/2010 | Spitzl | |
| 2010/0296977 A1 * | 11/2010 | Hancock | A61L 2/02 422/186 |
| 2011/0256732 A1 | 10/2011 | Maynard et al. | |
| 2012/0261391 A1 * | 10/2012 | Ihde | B22F 1/02 219/121.52 |
| 2013/0017342 A1 * | 1/2013 | Riccardi | C23C 16/513 427/562 |
| 2013/0270261 A1 * | 10/2013 | Hadidi | H05H 1/30 219/686 |
| 2014/0263202 A1 * | 9/2014 | Partridge | B23K 10/02 219/121.48 |
| 2016/0329191 A1 * | 11/2016 | Sieber | H01J 37/32082 |
| 2017/0287679 A1 * | 10/2017 | Ikedo | H01J 37/32834 |

* cited by examiner

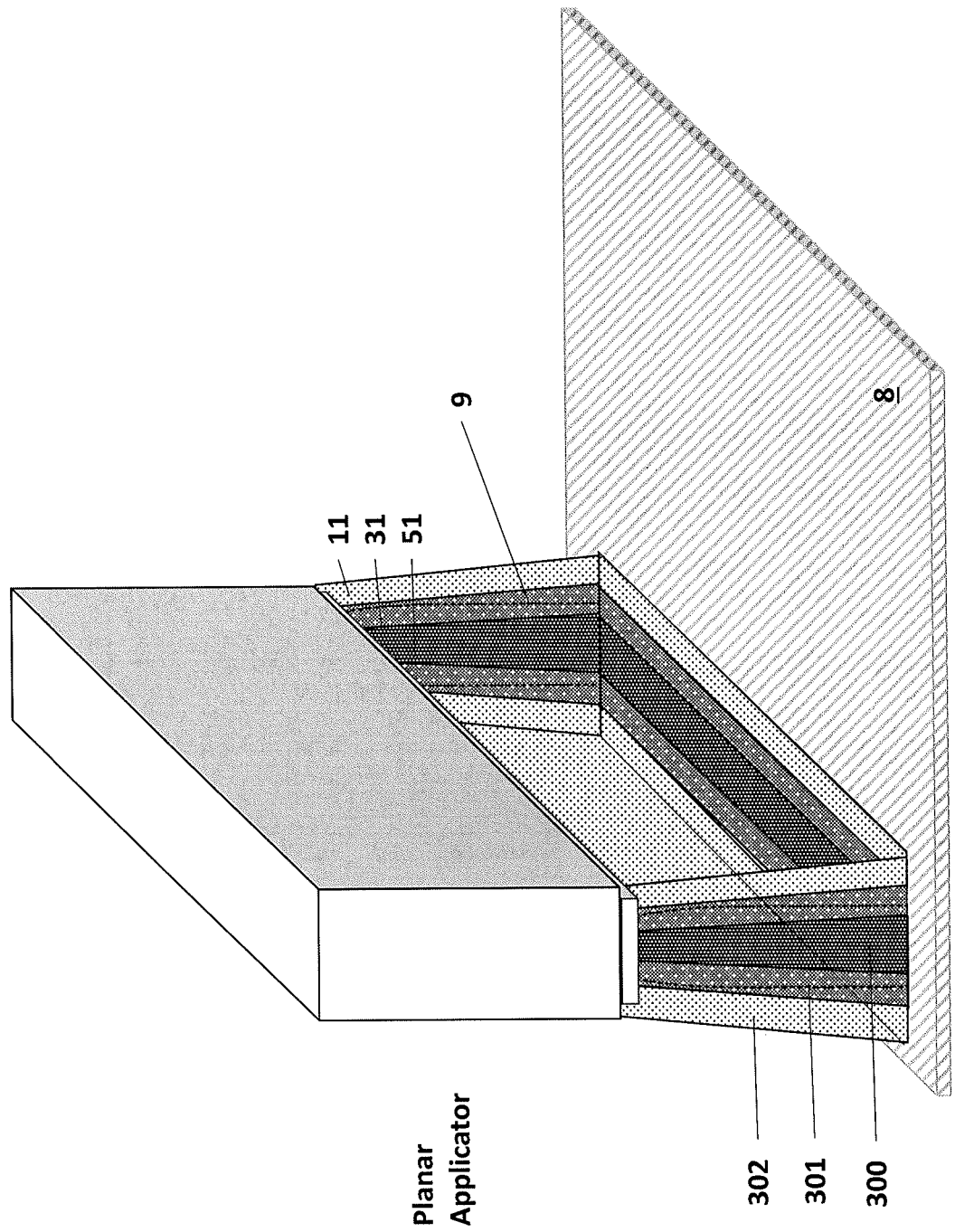

ATMOSPHERIC COLD PLASMA JET COATING AND SURFACE TREATMENT

CROSS-REFERENCE TO RELATED APPLICATION

This application is a non-provisional of U.S. Provisional Application Ser. No. 62/510,068, filed on May 23, 2017, entitled "ATMOSPHERIC COLD PLASMA JET COATING AND SURFACE TREATMENT FOR IMPROVED ADHESIVE BONDING PERFORMANCE OR DISSIMILAR MATERIAL JOINTS SUBJECT TO HARSH ENVIRONMENTAL EXPOSURE," the contents of which are expressly incorporated herein by reference in their entirety, including any references therein.

TECHNICAL FIELD

The disclosure generally relates to thin-film deposition at atmospheric pressure using an electromagnetically-driven cold plasma source, and more particularly to ultra-compact microwave plasma jet applicators with extended jet reach for hybrid cleaning/etching, plasma-enhanced chemical vapor deposition, and normal/reactive sputter deposition for engineered coatings and surface treatment.

BACKGROUND OF THE INVENTION

Using air plasmas for surface degreasing and activation have been effective for treating bare substrates; however, the benefits of such air plasma treatments expire after a few hours of ambient exposure. Functionalizing and then sealing the surface with a material coating, e.g. silane-based, alumina, yttria-stabilized zirconia, titanium nitride, diamond-like carbon, etc., can provide desirable surface properties, such as: corrosion/wear/impact resistance, lubricity, modified electrical/thermal transport properties, etc. Plasma-based vacuum coating techniques have been used for decades in semiconductor fabrication, photovoltaics, display and web coating industries; however, for many industrial applications there is a need for thin-film processing and deposition without vacuum chambers for in-field, in-factory and low-cost manufacturing.

Atmospheric pressure plasma systems based on dielectric-barrier discharges, corona jets, RF parallel plates and gliding/rotating arc discharges have been introduced for applications such as surface modification, surface cleaning and bacterial sterilization. A controlled rotating/gliding arc (e.g. PlasmaTreat, Relyon) operates at high power levels and can be combined with a precursor gas injection ring for deposition. However, the gas temperature is very hot and turbulent to avoid arc heating in one location. Thus, a plasma zone is only present a few mm away from the nozzle head when using a precursor gas injection approach for forming surface coatings. Moreover, multiple plasma generators are required for surface cleaning prior to coating—resulting in a bulky system suited best for flat, linear parts.

Non-equilibrium cold plasma atmospheric pressure plasma jets (e.g. Apjet, Surfx) run at 13.56 MHz excitation frequency. Such systems are quasi-continuous and have near-room temperature plasma jet energies. These systems are costly and require kW-level power supplies, electromechanical RF impedance matching circuits and tuning controllers with active water jacket cooling using chillers. The stability and uniformity of a radio-frequency discharge is limited by a critical power density beyond which the plasma becomes unstable leading to runaway arcing and debris generation. Adding larger molecular weight precursor species and reactive gas chemistries requires more power to strike and maintain the plasma reaching this limit sooner.

An alternative is the basic dielectric barrier discharge (DBD) that is limited in achievable power density spread over large flat plates. Companies, such as PSM Korea, tried to use this technique for large area cleaning and surface activation. Subsequent improvements of the basic DBD hybridized the original technique with a point-like encapsulated electrode to lower the required voltage for breakdown and added local gas flow to extend a plasma jet several cm to enable treating hard-to-reach surfaces to be treated.

SUMMARY OF THE INVENTION

The limitations of the above-summarized prior known approaches include: limited power-density, uniformity of gas flow (for multiple precursors and carrier gases), difficult depositing more than one type of material, non-uniformity in material deposition, arcing and debris generation, areal device scaling, and limitations in the plasma jet reach have forced end-users to compromise with multiple tool sets for use on flat substrates. Furthermore, these systems operate with separate source heads and power boxes to deliver high-voltage and RF energy over large umbilical cables that pose a challenge for the in-field/in-factory manufacturing environment. There are limited options for 3D-printed complex shape components, mixed material joining, high-precision aerospace components and specialty substrates.

An alternative approach is described herein with reference to the drawings to the ones described above. The alternative approach uses microwave power to drive the plasma with power density scalability, and the microwave power is coupled to gas discharge structures that combine gas from multiple sources with controlled gas flow environments to deliver a high-quality plasma jet to substrates.

In particular, a system is described herein for depositing a material onto a receiving surface, where the material is formed by use of a plasma to modify a source material in-transit to the receiving surface. The system comprises a microwave generator electronics stage. The system further includes a microwave applicator stage including a cavity resonator structure, wherein the cavity resonator structure comprises: an outer conductor, an inner conductor, and a resonator cavity interposed between the outer conductor and the inner conductor. The system also includes a multi-component flow assembly comprising: a laminar flow nozzle providing a shield gas, a zonal flow nozzle providing a functional process gas, and a source material flow nozzle configured to deliver the source material. Moreover, the source material flow nozzle and zonal flow nozzle are physically configured to facilitate a reaction between the source material and the functional process gas within a plasma region generated by the microwave generator electronics stage and the microwave applicator stage. Additionally, the plasma region is between an outlet of the source material flow nozzle and the receiving surface, and the laminar flow nozzle is configured to flow the shield gas so as to effectively isolate the functional process gas and the source material in the plasma region.

A method is further described herein for depositing a material on a receiving surface of a target material, where the material is formed by use of a plasma to modify a source material in-transit to the receiving surface. The method includes applying a shield gas flow that operates to achieve a clearing of the receiving surface of debris. The method further includes first applying a process/carrier gas flow, after the clearing, that operates to achieve a treating of the receiving surface, wherein the treating is taken from the group consisting of: cleaning the receiving surface and functionalizing the receiving surface. The method furthermore includes applying a centerline flow, after the treating, that operates to achieve an applying the material to the receiving surface. Moreover, during operation of the method, a cold plasma is superimposed on the process/carrier gas flow and the centerline flow to form a cold plasma jet.

Additional features and advantages of the invention will be made apparent from the following detailed description of illustrative examples that proceeds with reference to the accompanying figures.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 12 is an illustration of a planar version of the cold-plasma jet applicator for wide-area treatment.

DETAILED DESCRIPTION OF THE DRAWINGS

The detailed description of the figures that follows is not to be taken in a limiting sense but is made merely for the purpose of describing the principles of the described embodiments.

An integrated microwave-driven high-pressure plasma source system is described for materials processing. The illustrative system includes a small plasma launcher assembly attached to a coaxial power feed that can be easily mounted onto a robotic arm for in-line surface treatment and localized plasma cleaning, coating and activation. The microwave atmospheric-pressure cold-plasma jet delivers energetic species (ions, electrons, radicals), electric fields, UV light and precursors (e.g. metallo-organic chemicals, aerosols, nanoparticle suspensions, etc.) to surfaces without high temperatures that may degrade bulk material properties. The term precursor contemplates a wide variety of materials without limitation to the examples provided herein. Using a miniature coaxial head for laminar precursor injection, combined with in-situ microwave generation using GaN high electron mobility transistors—suitable for mounting on a robot arm, an extended plasma jet can reach into channels, grooves and complex joints for localized cleaning, surface functionalization and material coating.

Figure 1:
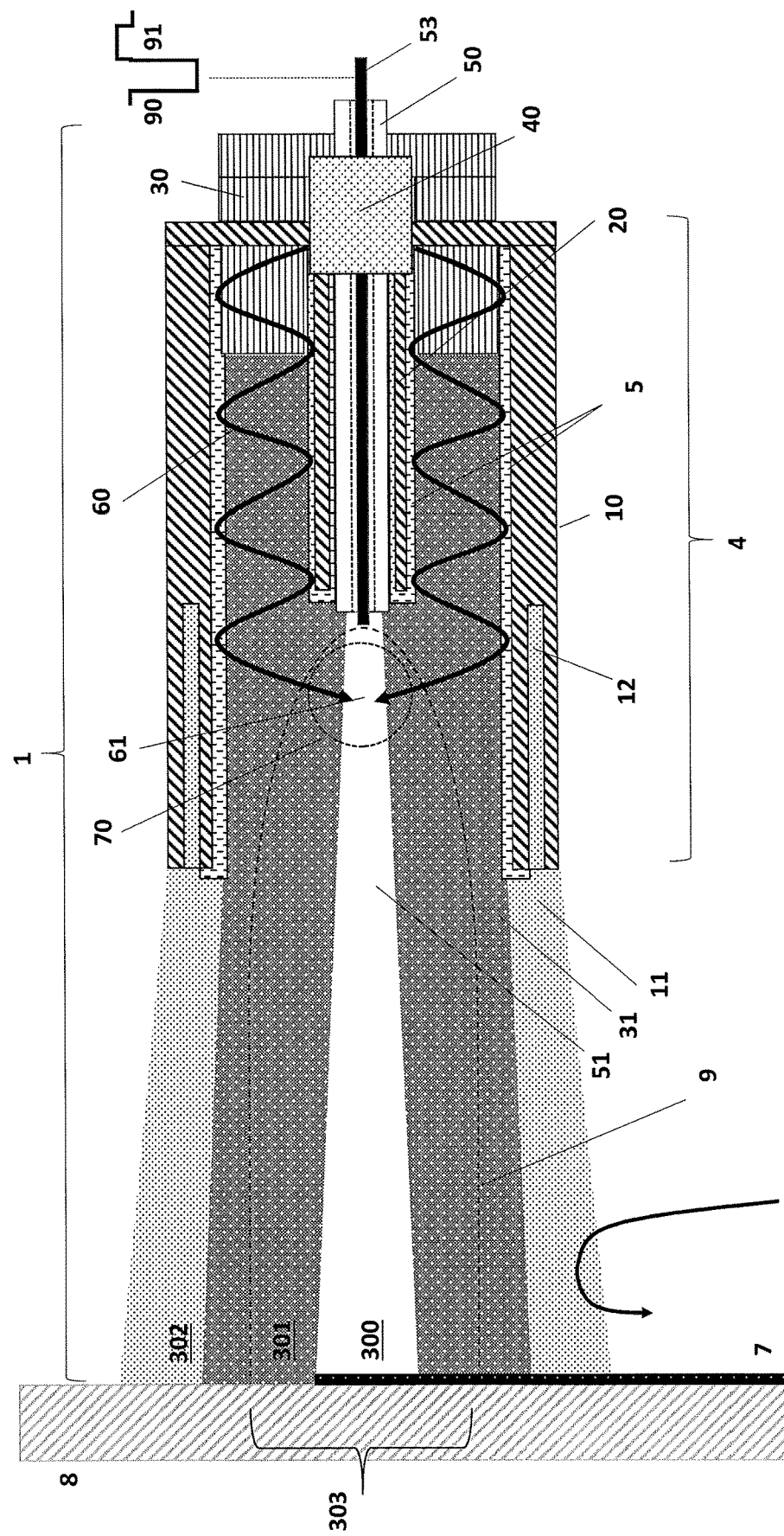
FIG. 1 is an overview illustration of a microwave cold plasma atmospheric pressure material treatment and coating system incorporating features of the invention.

Turning to FIG. 1, schematic cross-section provides an overview illustrative depiction of a cold-plasma jet system incorporating features of the disclosed system. A microwave plasma applicator 1 contains an outer conductor electrode 10 and an inner conductor electrode 20 forming a (coaxial or planar) cavity resonator structure 4 for the propagation of an electromagnetic energy 60 fed through a microwave feed-through 40. The configuration (coaxial or planar) of the cavity resonator structure 4, which is described further herein, eliminates the need for bulky waveguides at lower microwave frequencies, i.e. 500 MHz to 5 GHz, for the propagation of transverse electromagnetic (TEM) modes.

Designing the cavity structure 4 to enter an electromagnetic cutoff condition at a high field region 61 facilitates generating localized intense electric fields for producing a plasma (e.g. non-thermal electrons) and subsequent dissociation, ionization and radicalization of a material in the high field region 61. The use of microwave energy enables high power densities to be achieved in a small size, e.g. cm-length scales. Generated electrons are driven by the microwave energy 60 to dissociate and ionize precursor molecules and/or atoms introduced into the flow stream, and to generate radicals and metastable atoms and molecules for propagation downstream into a cold plasma jet 9 (within the region of the dotted arch outline).

The plasma jet 9 is stabilized and extended to a substrate 8 surface by a zonal streamline (laminar) flow field separated into three parts: a centerline flow 51, a process/carrier gas flow 31, and an outer shield gas flow 11. The outer shield gas flow 11 serves to prevent contaminants 6, e.g. water, external oils and vapors, from entraining into the cold plasma jet 9 and a plasma chemistry/reaction region including, for example, a zone 300 primarily occupied by a source material and a zone 301 primarily occupied by the process/carrier gas on or near the substrate 8 surface. The outer shield gas flow 11 is introduced through the laminar flow manifold 12 housed in or near the outer conductor electrode 10. The processing/carrier gas flow 31 is introduced through a zonal flow system 30 that parallelizes the processing/carrier gas flow for introduction into the cavity resonator structure 4. The parallelized processing/carrier gas flow is directed by the zonal flow system 30 towards the substrate 8 at sufficient velocity to transport the process/carrier gas through a plasma generation zone 70 near the high field region 61 and continue onward to the substrate 8 to be treated by the gas flow combination.

In accordance with illustrative examples, the zonal flow system 30 is an enabler for extending a reach of the cold plasma jet 9 toward to substrate 8 surface. The zonal flow system 30 operation is further configured/tuned to control the precise composition of the thin-film deposition at the zone 300 and process gas chemistry at the zone 301 proximate the substrate 8 surface. The centerline flow 51 is injected directly through a hollow passageway within the inner conducting electrode 20 or through an intermediary dielectric 50 that serves to isolate precursor gases, carrier gases or sputter material feedstocks provided at a feedstock 53. The inner conductor electrode 20 and the outer conductor electrode 10 may be surrounded with a dielectric material 5 for electric potential isolation of the cold plasma jet 9 from the microwave plasma applicator 1. This physical/electrical arrangement facilitates application of a first potential 90 and/or a second potential 91 to be applied to the system for actively biasing the plasma or sputtering material from the feedstock 53 for injection into the plasma jet 9 flowstream to the substrate 8.

A thin-film coating 7 is deposited onto the substrate 8 through the direct plasma deposition in the zone 300 and interaction with a reactive plasma chemistry in the zone 301 in the outer region of the plasma jet 9. Reactive deposition forming nitrides, oxides, carbines, borides, and fluorides in the thin-film coating 7 can be achieved with this method. The generated plasma radicals and ions facilitate direct deposition in the zone 300 and transformation of materials at the substrate 8 surface in the zone 301. The shield gas in the outer shield gas flow 11, which encounters the substrate 8 surface at a zone 302, inhibits contaminants 6 from flowing into a zone 303 where the plasma jet 9 impinges the substrate 8 surface. The microwave plasma applicator 1 is flexible for different combinations of precursor, process gas and carrier gas injection, such as feeding precursor materials through the zonal flow system 30 for deposition over a larger area and entrain with different gas-phase chemistries in the process/carrier gas flow 31 and the centerline flow 51 for the plasma jet 9.

Figure 2:
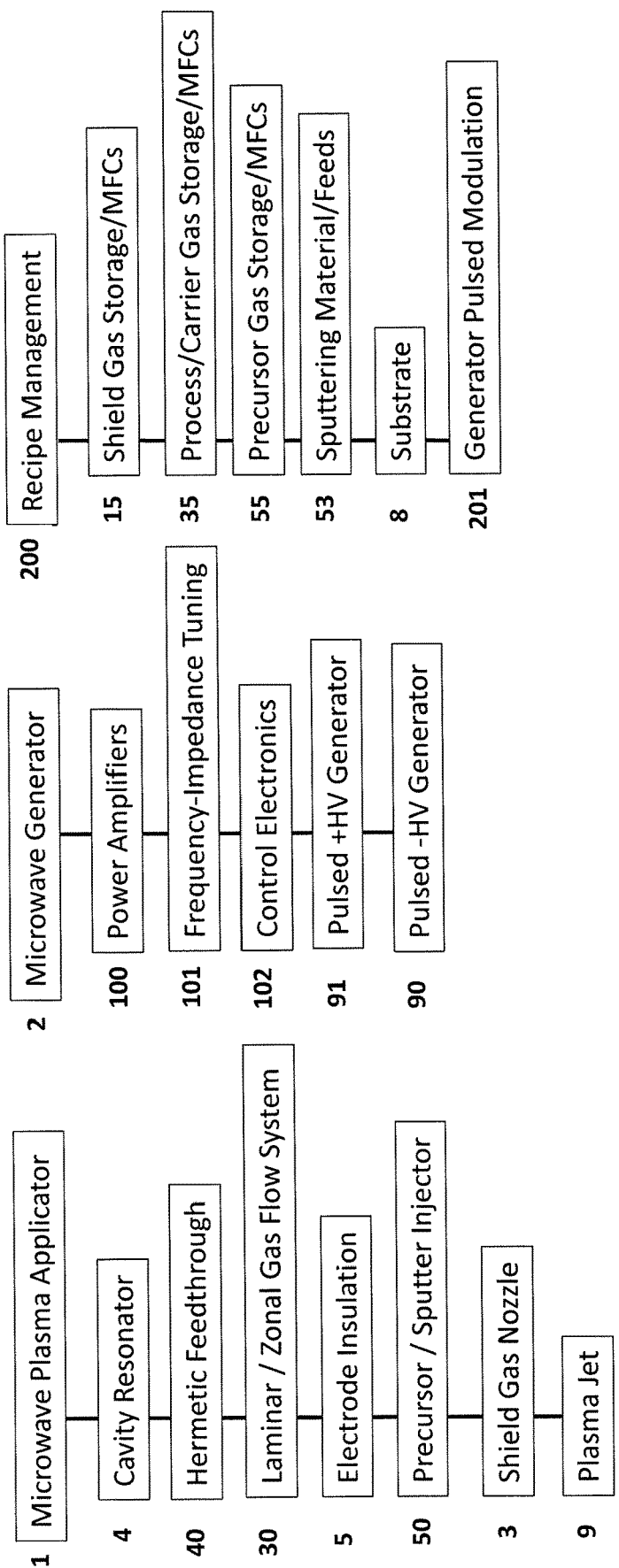
FIG. 2 is a functional block diagram of subsystems including optional elements.

Turning to FIG. 2, a functional block diagram is depicted that highlights subsystems for the microwave plasma applicator 1, a microwave generator 2 and the thin-film and a processing recipe management 200. The microwave plasma applicator 1 includes the cavity resonator structure 4, which is typically coaxial or planar, and the microwave feedthrough 40, which is typically hermetic metal-ceramic with tailored dimensions and permittivity for impedance matching from the microwave generator 2 to the cavity resonator structure 4 for efficient input coupling to produce the electromagnetic (microwave) energy 60. The microwave plasma applicator 1 also contains the zonal flow system 30 for injection of process/carrier gas. The zonal flow system 30 is made, for example, of an array of capillary tubes having a large length-to-diameter ratio to parallelize the flow of the process/carrier gas flow 31 injected into the cavity resonator structure 4. Centerline flow precursor or sputtered material can be injected through a passage within the intermediary dielectric 50. A shield gas nozzle 3 may be added for protection against debris, contaminants, and/or unwanted water and other vapor.

The microwave generator (including power delivery structures) 2 may be attached directly to the microwave plasma applicator 1 or, alternatively located some distance away from the microwave plasma applicator 1. Using a solid-state power amplifier 100, the microwave components can be directly integrated into the system for compactness, elimination of extraneous cabling and safety, or they can be supplied externally over a coaxial feed. An impedance measurement and microwave frequency control 101 facilitates maintaining/tuning plasma strike, plasma sustain, power delivery and adaptive control over changing load conditions. Contained within the microwave generator 2 are a control electronics 102 that facilitate communication to the outside world, maintenance and operation of the system.

Optional high-voltage generator biasing at the first potential 90 and/or the second potential 91 are included for pulsing.

Substrate 8 surface cleaning, oxidation and removal of materials, and thin-film deposition and chemistry are handled with the processing recipe management 200. The processing recipe management 200 system controls a shield gas mass flow 15, a process/carrier gas mass flow 35, a precursor mass flow 55, the introduction of any sputtering feedstock 53, as well as the pulsed modulation of the microwave generator 201. The processing recipe management 200 system also coordinates with external parameters such as substrate 8 movement, positioning with robotic arms, sequencing, etc.

Notable aspects of the above-described system (and associated operation) include low direct current (DC) voltage usage for end-user for safety, an integrated microwave generator in plasma source head, long laminar jet flow with precursor injection or pulsed DC sputtering on the centerline for downstream mixing, and higher-frequency operation for stability and power delivery, including pulsed microwaves. The coaxial nature of the power feed facilitates precursor injection into the shield gas flow, thereby eliminating a need for a separate gas collar. The coaxial power feed structure maintains the jet-like nature of the microwave fed discharge to allow local plasma (ions, electrons, radicals, etc) to penetrate complex part features for surface modification. The laminar flow stream can be improved with multiple channel sets for both the centerline precursor and shield gas will extend the jet further. The advantage of this approach is that all the microwave electronics can be integrated into the plasma source head that will mount to the robot arm so that <300V is fed into the unit for base operation with process gases. Advanced operation with sharp DC sputtering for direct material deposition into the plasma flowstream and/or positive biasing of the plasma to add ion energy to the substrate for texturing, nitriding and improved coating hardness can utilize an integrated DC/DC high-voltage converter, externally-provided pulsed DC with ground-shielded cabling for safety, inductive coupling or other voltage application means.

As evidenced by the discussion of FIGS. 1 and 2 above, the coaxial or planar microwave electrode structure geometry allows for centerline precursor material injection with microwave power delivery surrounded by a process/carrier gas flow process gas flowstream that can also be supported by an external shield gas curtain, e.g. compressed air, dry nitrogen or argon. With gas, liquid, aerosolized and micro/nanoparticle injection, one group of precursors can be introduced into the plasma zone continuously or pulsed. Separate sputtering electrodes can be actuated.

The external shield gas prevents entrainment or entrapment of external contaminants, water vapor or other gases present and laminar flow is desired. Laminar flow is not required; however, the plasma volumetric extent and plasma jet reach is influenced by the gas flow, mixing and flow boundary conditions. The process gas flow is typically dry air, dry nitrogen, dry oxygen or argon gas. For some process conditions, wet air or saturated water vapor air is desired for the plasma chemistry. The precursor gas delivery can also be further improved with laminar flow injection along the centerline to confine the reaction products and materials for coating into a specific region on the substrate for deposition and treatment. One way for achieving laminar flow distribution is to utilize an array of smooth capillary channels with long L and small D to linearize gas flow. A dielectric straw bundle for elongated plasma jet propagation to minimize gas mixing and plasma quenching. With this direct injection there is minimization of backflow that can clog the injector (which plagues older concepts) and achieves the advantage of material deposition localization on a target substrate. This type of arrangement can be used in the center coaxial segment as well as the process plume region. For the external shield gas flow, a thin annular channel can be used along the outer wall of the microwave plasma applicator for isolation.

The interior of the microwave applicator forms a cylindrical cavity resonator with centerline electrode and the outer annular electrode. These surfaces may be completely coated with dielectric material or have a dielectric insert cover their surfaces, e.g. quartz or alumina ceramic. The insulator serves to resist accumulation of electrons and maintain plasma density over large areas/lengths for higher power efficiency. The insulation also minimizes the chance for localized arcing encountered during off-normal events. The additional effect of insulation allows for pulsed bias voltages to be applied to inserted electrodes for externally-controlled biasing, i.e. sputtering or positive biasing.

Since the electron characteristic length at microwave frequencies is very small the microwave plasma applicator head can be very small (cm-scale diameters) for moderate power levels (~0.1-1 kW) that is ideal for mounting on small robotic arms and in-line processing machines. Pulse plasma generation and higher power levels into the tens of kW are also achievable with the power density scalability of microwave plasma generation. For higher power devices, supplemental heat transfer such as water cooling may be required beyond the process and shield gas flow for normal device cooling.

With direct microwave injection near the nozzle tip on the microwave applicator, very high specific power density is maintained to pump the plasma flow stream to multiple cm length scales downstream—this would allow direct plasma contact onto complex part surfaces and multimodal parts, e.g. a vehicle light weighting dissimilar material joint or complex 3D-printed parts. Coaxial precursor gas delivery allows outer annular shell to clean surface, then precursor flow stream coats surface and then opposite annual shell activates surface in one pass. The zonal flow facilitates the surface material treatment and coating properties.

Integrating solid-state microwave power amplifier components directly onto the microwave applicator decreases cable length, losses, electrical safety hazards and allows for local impedance matching and control. Safety increases since only low voltages are seen on the manufacturing floor. The coaxial design allows the microwave propagation to be cut-off from leaving the end of the plasma source head; so, there is minimal microwave leakage since the generation and absorption of microwaves occurs entirely in the unit.

On arrangement of the apparatus microwave launcher facilitates direct power injection without needing an impedance matching network to maintain a low-cost structure. High gain 0.1-1 kW-class solid-state GaN microwave power amplifiers may replace conventional cavity resonator magnetrons (e.g. microwave ovens) and planar triodes. As a result, small powerful amplifier circuits can be directly integrated with (or at least placed a short distance away from) the microwave applicator. This minimizes power losses and enables high-Q microwave applicator designs for very high electric field conditions for low microwave input power. Plasma generation less than 100 W is achievable with these integrated system designs for very small applicators. Compared to lower-frequency AC/RF, the microwave plasma has greater stability and operation over a range of electronegative gases and high molecular weight. The non-thermal cold plasma microwave source will be more stable than conventional atmospheric RF plasma jets at higher power densities, have lower gas temperature than the continuous arc and be coaxially guided for very compact size.

Using all solid-state power amplifiers facilitates using frequency tuning to achieve peak forward power under reactive gas chemistries and variable load at atmospheric pressure—similar to the frequency matching presented in U.S. Pat. No. 9,867,269 for microwave surface wave plasma generators. The physical structure of the microwave applicator is designed for power feed into the coaxial applicator cavity to build up electromagnetic energy in a high-Q configuration. The hermetic feedthrough insulator that couples the coaxial applicator cavity from the external microwave generator electronics is designed to adapt the traditional 50 Ohm stripline components in the amplifier to the specific impedance of the microwave applicator cavity. This allows high power input to achieve plasma breakdown and the generation of the conductive plasma load. This new load will change the microwave applicator cavity electromagnetic transmission properties resulting in a load impedance mismatch. A control circuit can sense change in load condition for initial plasma strike, change in plasma load conditions, adjustment in gas flow, etc. and the control circuit can adjust the frequency of excitation to shift impedance to a minimum state for high-efficiency power utilization. This eliminates traditional mechanical tuning systems, lowers cost, improves response time and allows customization on the fly for variable processing conditions—particularly pulsed operation.

The frequency tuning is also important for localization of the electric field minimum and maximum for the propagated EM wave mode. Frequency adjustment allows for optimization of the localization of the plasma. This is important for pulsed operation, sputtering and bias applications. Control feedback on the length of the plasma jet can be achieved via optical sensing.

Pulsed microwave energy at very high powers with a reduction in duty factor can achieve more with less. Higher microwave power density (i.e. 1 kV at 10% duty factor vs. 100 W CW) will generate higher dissociation fractions and ionized precursors, process gas and carrier gases. This is desirable for reactive deposition forming nitrides, oxides, carbines, borides, and fluorides which be achieved with this method. The plasma radicals and ions will enable direct deposition and transformation of materials.

Figure 3:
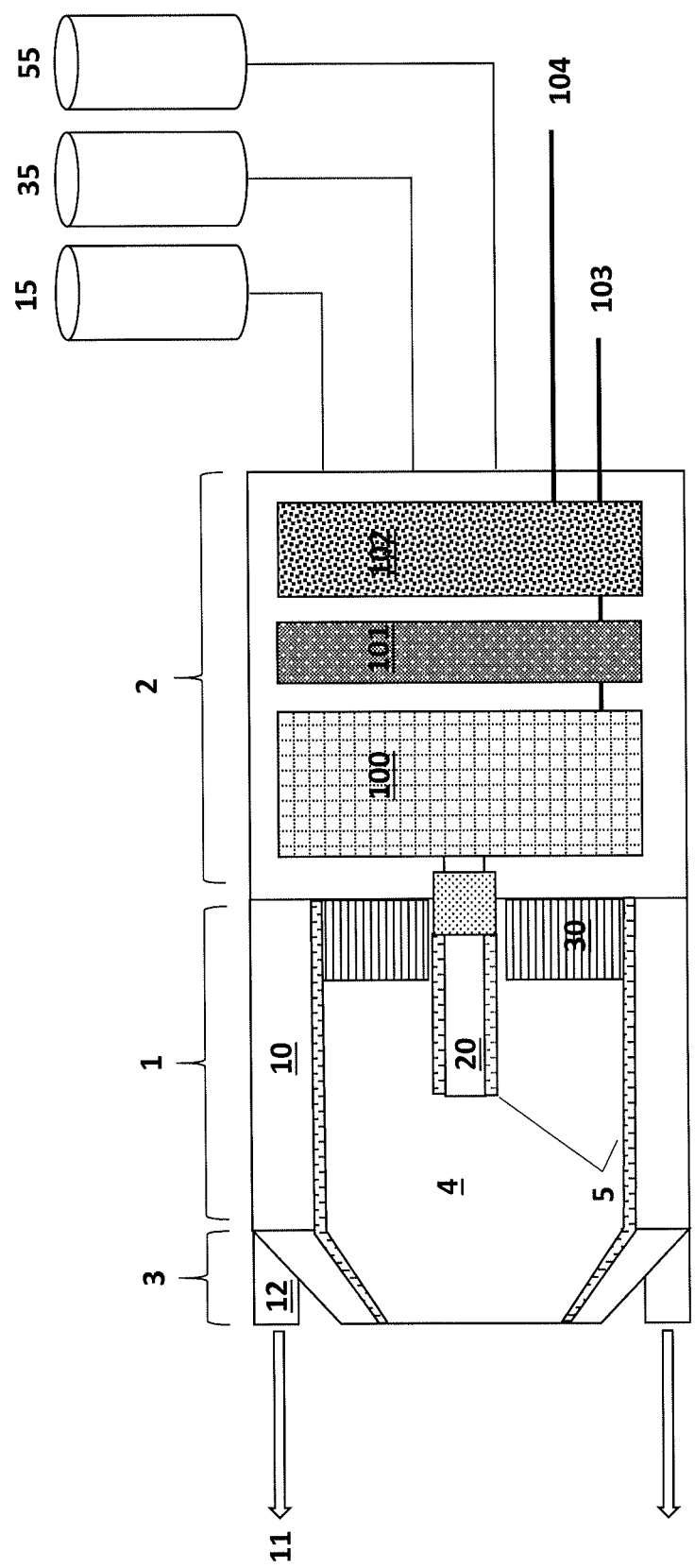
FIG. 3 is a schematic drawing of a system identifying key elements including annular shield gas flow.

Turning to FIG. 3, a functional cross-sectional diagram is depicted that shows several functional elements for the microwave cold plasma jet system for material deposition—including an optional annular shield gas flow and associated nozzle. The microwave plasma applicator 1 comprises the cavity resonator structure 4 formed by the outer conductor electrode 10 and the inner conductor electrode 20 which can be hollow annuli for transporting and inserting material or operating as a pass-through for other functional elements, such as the outer shield gas flow 11 through the laminar flow manifold 12 (e.g. nozzle). The material for the conductor is, for example, copper for high conductivity and minimizing power loss. At microwave frequencies the electromagnetic energy transport is limited to a few skin depths, and therefore copper plated aluminum is an acceptable conductor material. Other variations are possible depending on particular applications and circumstances. The zonal flow system 30 streamlines the process/carrier gas flow 31 into the coaxial resonator structure 4. The zonal flow system 30 may be comprised of an array of capillary straws over a gas plenum to generate highly-directed streamline flow. The zonal flow system 30 may comprise metallic, dielectric or a combination of both types of material. Microwave energy is generated by the microwave generator 2 and fed into the microwave plasma applicator 1 through the microwave feedthrough 40 that provides impedance matching capability from the solid-state power amplifier stage 100 to the cavity resonator structure 4. Impedance matching is achieved with custom tailoring of the dielectric material permittivity, ratio of inner/outer conductors, graded transitions to minimize impedance discontinuities and balancing material bonding choices. The microwave feedthrough 40 should be hermetic to separate gas flow and reaction products in the microwave plasma applicator 1 and the basic electronic elements for the microwave generator 2. In addition to the solid-state power amplifier 100, within the microwave generator 2 there is a low-power driver and voltage-variable oscillator stage provided in the form of the impedance measurement and microwave frequency control 101 that is configurable to facilitate generating continuous-wave or pulsed bursts of microwave energy to feed the solid-state power amplifier 100. There is also a control and feedback stage, in the form of the control electronics 102, that communicates with the external world for carrying out control, monitoring and actuation functions. The control electronics 102 facilitate impedance matching via frequency control and other inputs for temperature, light sensing, forward and reflected power and condition of the unit. Inputs into the microwave plasma generator 2 include the DC power driving an electronic circuitry 103 and a communications data in/out 104. The dielectric layer 5 may be inserted freestanding or permanently bonded to either the outer conductor electrode 10 or the inner conductor electrode 20 having a coaxial arrangement, to provide electrical isolation for active biasing or to improve plasma confinement and density. The shield gas mass flow 15 for the laminar flow manifold (nozzle) 12, the process/carrier gas mass flow 35 for the zonal flow system 30 and precursor/centerline gas feed 55 for the inner conductor electrode 20 for gas delivery on the centerline. Laminar directed flow: (1) minimizes turbulent mixing that, in turn would undesirably limits plasma jet 9 reach, and (2) entrains the precursor material feed along the centerline for injection in the plasma zone for volatilization, dissociation and ionization.

Figure 4A:
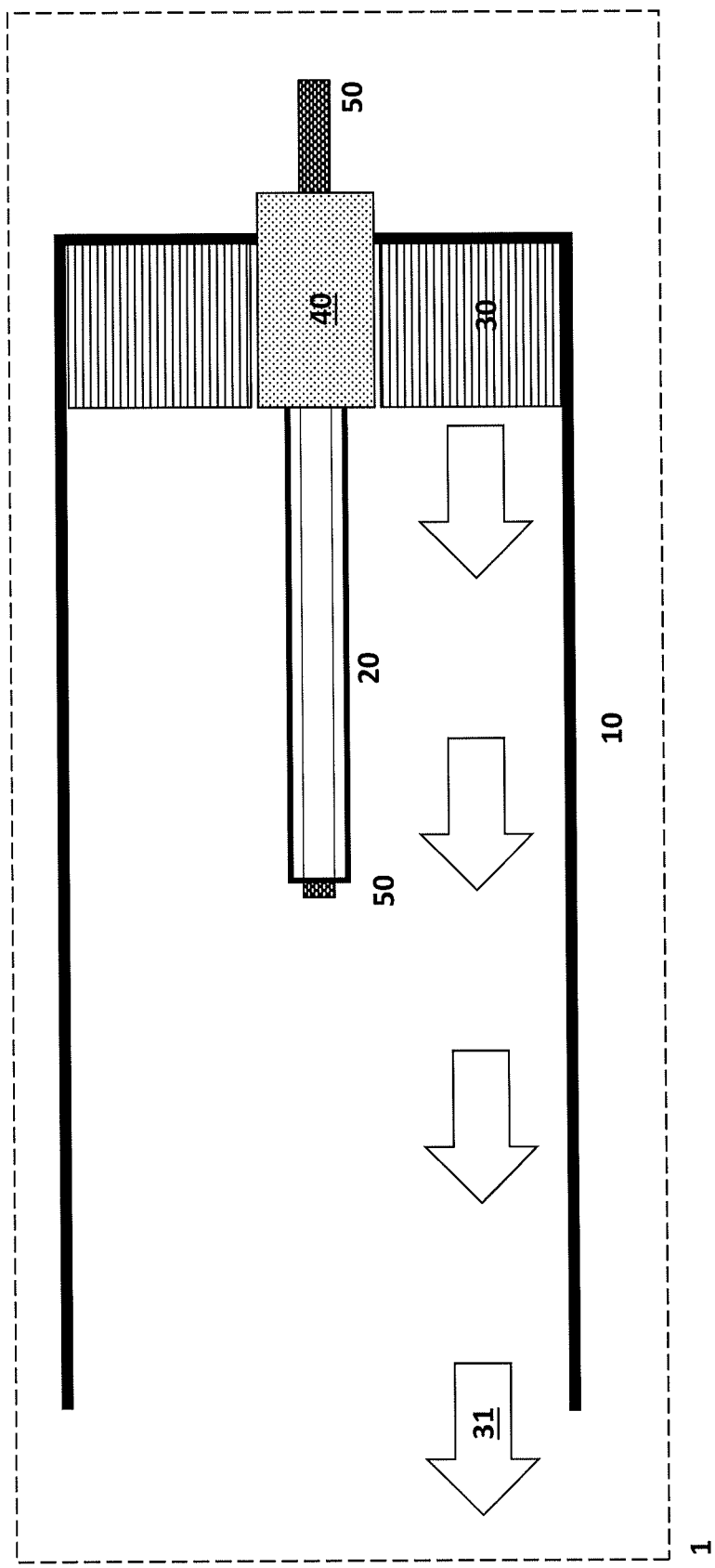
FIG. 4A depicts a cross-sectional view of the microwave plasma applicator, including coaxial conductor elements, hermetic insulator break and laminar carrier gas injection.

Turning to FIG. 4A, a cross-sectional view is depicted of the microwave plasma applicator 1, including the coaxially arranged outer conductor electrode 10 and inner conductor electrode 20, microwave feedthrough 40 and the zonal flow system 30 configured to inject process/carrier gas. Arrows depict the laminar flow of the process/carrier gas flow 31 through the microwave plasma applicator 1. Also shown is the intermediary dielectric 50 that contains one or more channels for feeding the precursor gas, carrier gas, sputter material and/or additional electrodes for active biasing or pulsing into the microwave plasma applicator 1.

Figure 4B:
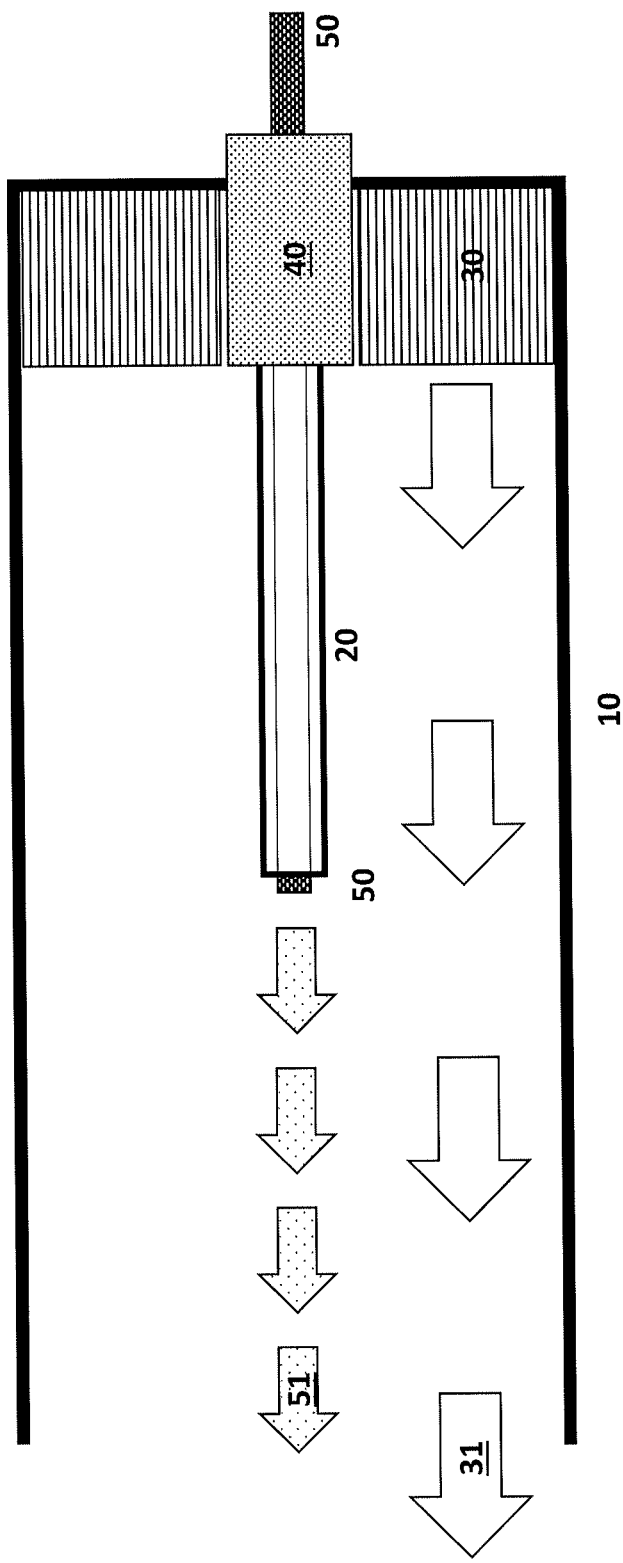
FIG. 4B depicts a cross-sectional view of the microwave plasma applicator with centerline gas injection through the central electrode.

FIG. 4B supplements the teachings of FIG. 4A by depicting the centerline flow 51 in addition to the process/carrier gas flow 31 from the zonal flow system 30 configured to inject gas into the cavity resonator structure 4. This structure enables precise delivery of the chemical precursor materials injected into the microwave plasma applicator 1 for transport to the substrate 8 to be coated (not depicted in FIG. 4B).

Figure 4C:
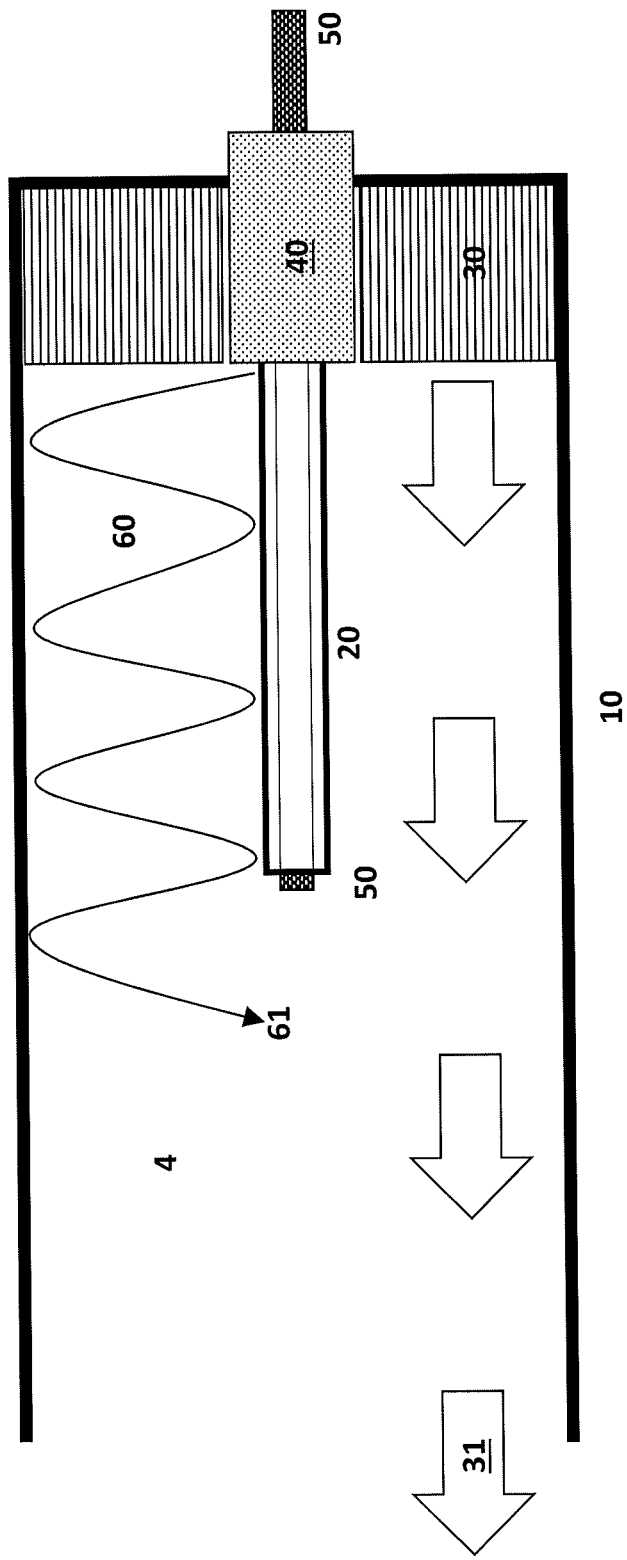
FIG. 4C depicts microwave electromagnetic energy injection into the applicator with wave energy going into cutoff condition in front of the centerline gas injection location.

FIG. 4C depicts microwave electromagnetic energy 60 injection through the microwave feedthrough 40 into the cavity resonator structure 4 of the microwave plasma applicator 1. The cavity resonator structure 4 supports electromagnetic propagation (e.g. TEM modes) until reaching the cutoff condition where the microwave electromagnetic energy 60 frequency will not allow propagation in the remaining outer conductor electrode 10. The electromagnetic energy 60 propagates down the length of the inner conductor electrode 20 until it encounters a cutoff condition in front of the abrupt termination of the inner conductor electrode 20, which is proximal the intermediary dielectric 50 at a centerline gas injection location. The cutoff condition causes the electromagnetic energy to reflect and, in turn, generates the (extremely) high field region 61 that is ideal for plasma generation. The design of the cavity resonator structure 4 is based on the diameters and axial lengths of the inner conductor electrode 20 and the outer conductor electrode 10, the presence of dielectric insulating materials (such as the dielectric material 5), and the material properties of the zonal flow system 30 and the intermediary dielectric 50.

The operational frequency range for the microwave plasma applicator 1 may be based on the values chosen for each construction. 915 MHz or 2.45 GHz are typically chosen due to the ISM bands for industrial use at these frequencies and the availability of cavity magnetron emission devices. However, with solid-state microwave power amplifier construction, a wider range of frequencies are accessible and available with typical values ranging from 500 MHz to 2.5 GHz.

Figure 4D:
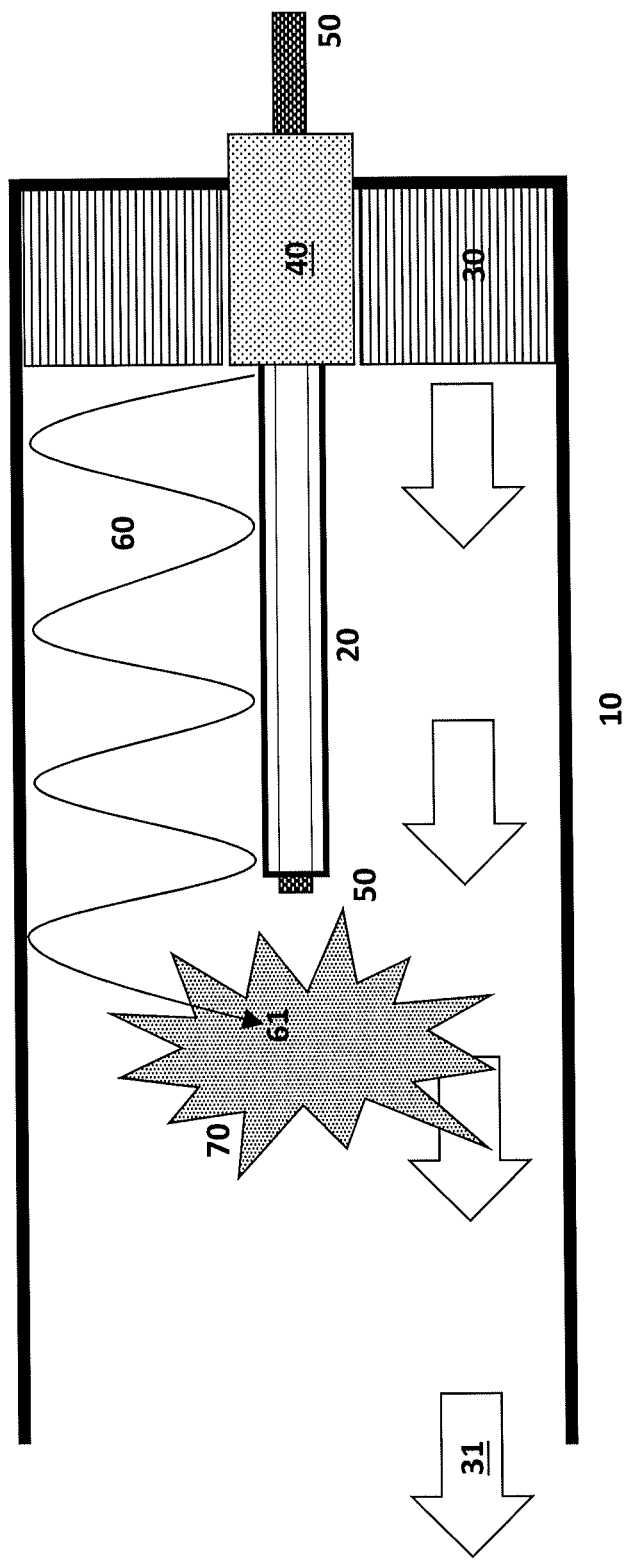
FIG. 4D depicts the intense electric field at the cutoff location and generation of carrier gas plasma for breakdown and sustainment of high density electrons, ions, excited states and radicals.

FIG. 4D depicts the intense electric field region 61 at the cutoff location and generation of the plasma generation zone 70 for breakdown and sustainment of high density electrons, ions, excited states and radicals. The microwave electromagnetic energy 60 feeds into the cutoff location and the high field region 61 moves electrons non-thermally to ionize additional electrons to bootstrap plasma.

Figure 4E:
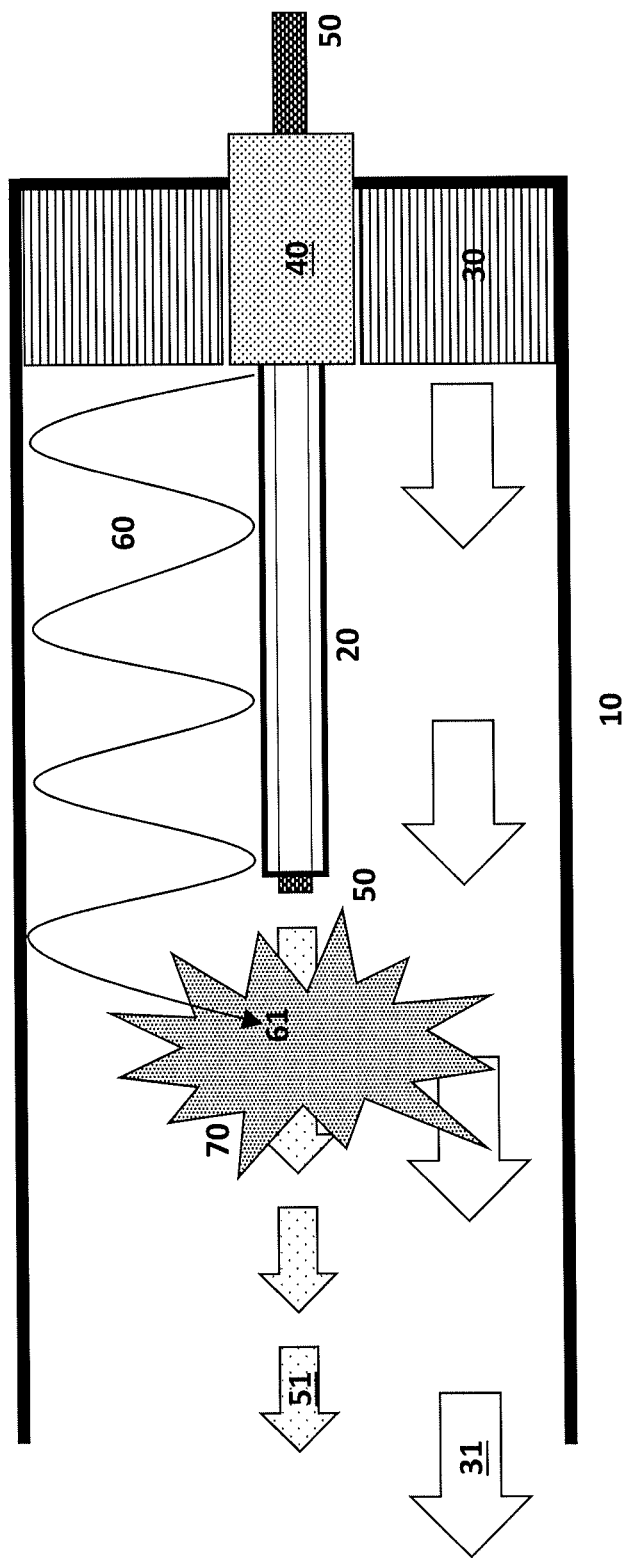
FIG. 4E depicts the combination of microwave plasma generation and centerline precursor injection.

FIG. 4E depicts the combination of the plasma generation zone 70 and centerline flow 51. The chemical precursor materials pass through the intense electric field in the plasma generation zone 70 and are dissociated, ionized and broken into constituent materials for transport in the centerline flow 51 that is also affected by the process/carrier gas flow 31 surrounding the centerline flow 51. The bulk motion of the gases will entrain metastable atoms and molecules that are excited in the dense plasma region 70 and carried forward out of the microwave plasma applicator 1 and towards the substrate as a plasma jet. The proximal location of both the high field region 61 (i.e. region having an intense electrical field) at the cutoff location and the direct injection of the centerline flow 51 and the process/carrier gas (zonal) flow 31 enhances power coupling into the materials needed for plasma chemistry and functionalization of the thin-film as well as thin-film growth.

Figure 4F:
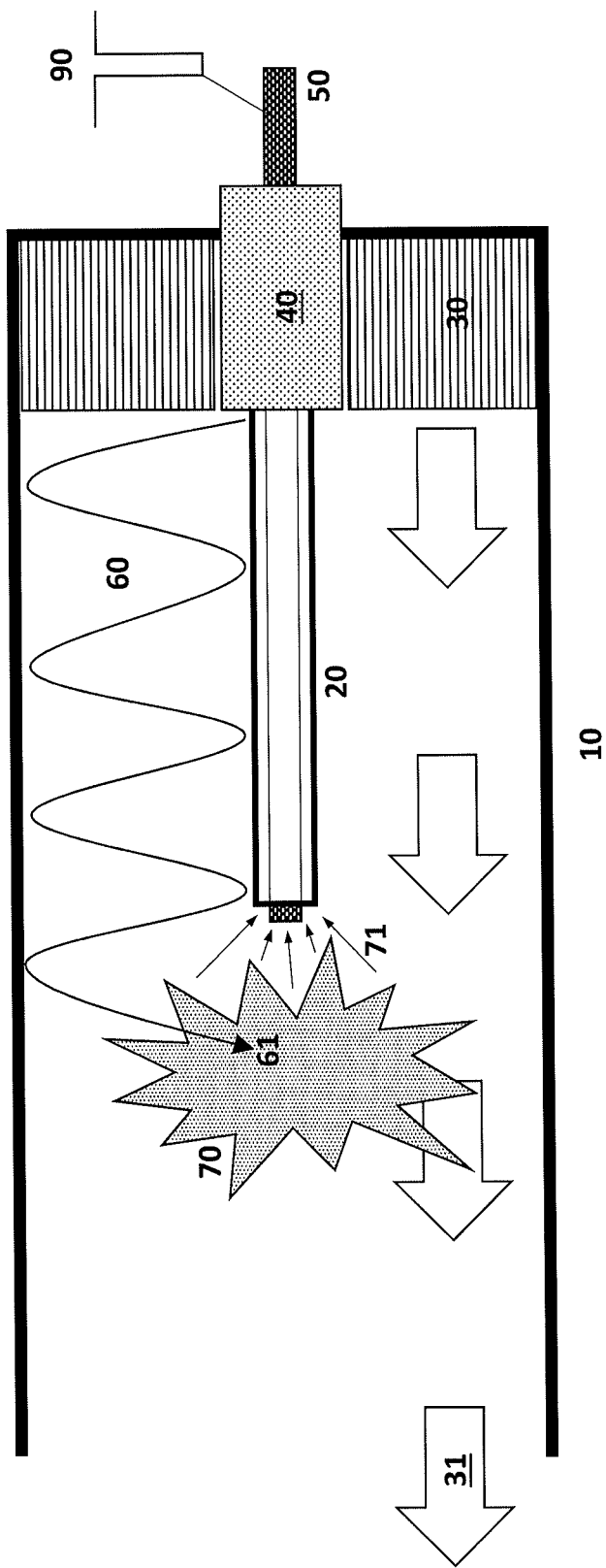
FIG. 4F depicts the application of negative DC pulsing on a central electrode to attract ions from the local plasma.

FIG. 4F depicts the application of negative DC pulsing at the first potential 90 on a sputtering material feedstock 53 electrode (not shown) within the intermediary dielectric 50 within the inner conductor electrode 20 forming the cavity resonator structure 4. The intense plasma generated in the plasma generation zone 70 generates significant population of ions 71 and the application of the negative DC pulse at the first potential 90 will attract the ions 71 that will gain energy in the plasma sheath that forms around pulsed feedstock 53 electrode (not shown, but contained within the intermediary dielectric 50). The intense source of ions 71 from the plasma generation zone 70 will serve as the sputtering population to remove material from the feedstock 53 electrode and introduce copious numbers of feedstock atoms into the centerline flow 51 for transport to the substrate to be coated. Central to the illustrative examples is the formation and source of dense, populous ions 71 from the microwave-driven plasma of the plasma generation zone 70 to facilitate the sputtering process without reliance on cathode spots, high-pressure arcs and filamentary microbursts to liberate material from the feedstock 53 source. This arrangement enables lower voltage, lower power operation compared to cathodic arc generators, filamentary arc generators and more conventional plasma spray processes where thermal, molten and evaporative blobs of material are common vs. the atomistic, precise outcome from sputtering.

Figure 4G:
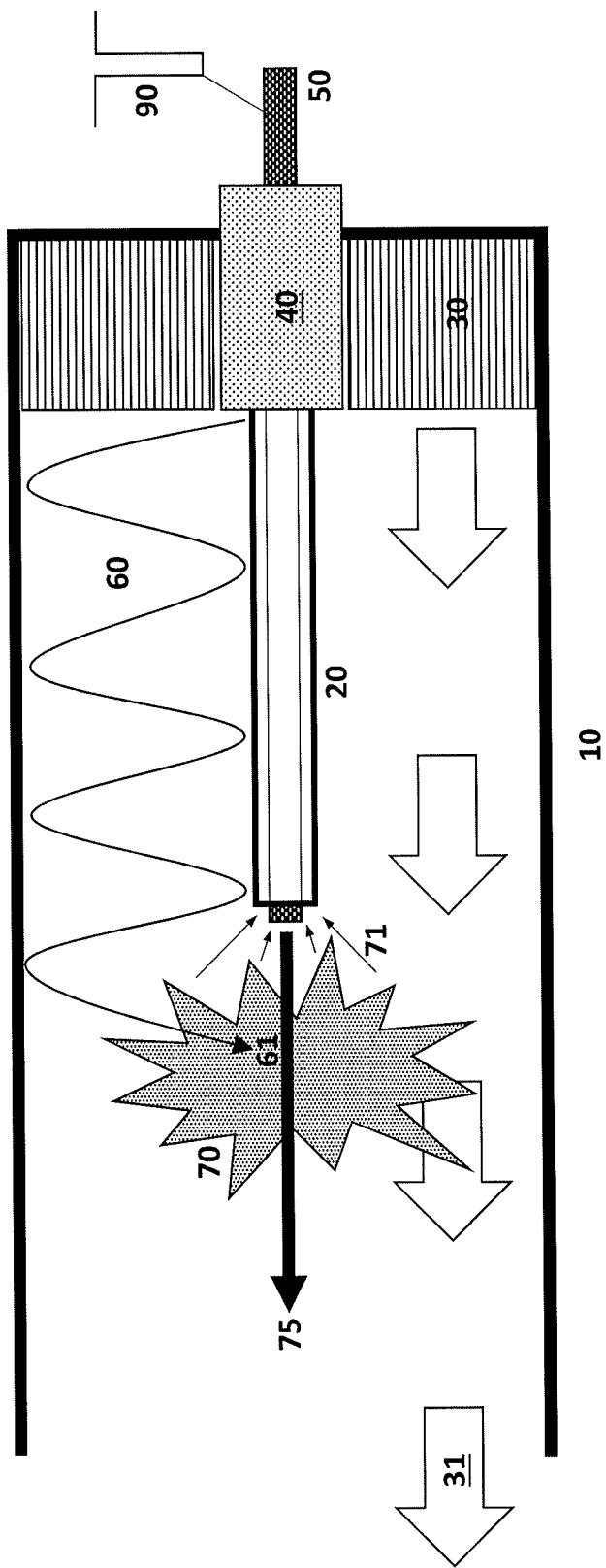
FIG. 4G depicts the physical sputtering of material off a central electrode from the application of pulsed-DC biasing to generate atom flux of the material towards the substrate.

Turning to FIG. 4G, a depiction is provided of the physical sputtering of material off the feedstock 53 electrode (not shown, but within insulator 50) by ions 71 from the application of pulsed-DC biasing at the first potential 90 to generate an atom flux 75 of the feedstock 53 material towards the substrate. This atom flux 75 becomes entrained in the centerline flow 51 and is incorporated into the thin-film source material to be deposited on the substrate in a manner reminiscent of vacuum sputter deposition. Designing the cavity resonator structure 4 to achieve cutoff condition for electromagnetic energy 60 propagation in close proximity to the sputtering feedstock material 53 enables a very high population of the ions 71 for sputtering to minimize power and voltage requirements suitable for a small in-line microwave cold plasma jet applicator. This design promotes high sputtering rates with consistency for in-line manufacturing. Notably, debris generation is minimal for high quality thin-film deposition. The negative DC pulse at the first potential 90 can be applied with a Starfire Industries IMPULSE 2-2 pulsed power module or similar device. For microwave plasma applicator 1 designs using insulating layering 5 on the inner conductor electrode 20 and the outer conductor electrode 10 of the cavity resonator structure 4, the negative DC pulsed bias at the first potential 90 will accelerate electrons from the plasma generation zone 70 and the cold plasma jet 9 region onto the material coating of the thin-film coating 7 deposited onto the substrate 8. The pulsed electrons will transiently heat the thin-film coating 7 and provide means for stress relief, lattice growth and ordering.

Expanding upon FIGS. 4F and 4G, the DC pulsed power module can be configured to supply energy to sputter a target material into the plasma flow stream for deposition. The DC pulse onto a secondary electrode or a central wire feed will use the ions from the microwave plasma to sputter the material without relying on an arc for generation of the plasma. The microwave-generated plasma source provides the high-density ions needed for the secondary sputtering process that will generate a burst of atoms into the gas flow stream. The microwave plasma provides the seed plasma to start and sustain this process. The microwave plasma seed promotes sputtering and not cathodic arc deposition with cathode spots, spits, splatter and debris particles that may ruin the substrate/film and the source. The system and structures described herein permit user control of the introduction of material into the plasma flow stream to the substrate. The material can be fed down the coaxial center with a single feed, two feeds or four feeds or even more feeds if desired. Typically, alumina insulated tubes are used to feed the material for separate insulation and small enough diameter to minimize microwave leakage.

The plentiful ions generated by microwave plasma proximal to the material feed allows high-current, high-power impulse sputtering akin to HiPIMS processes used in vacuum deposition. The inventors on this application have developed the Starfire Industries IMPULSE power module for vacuum sputtering and ionized PVD thin-film deposition. The microwave plasma provides the seed plasma for the sputtering process. Short, intense negative DC pulses in the range of 500-2000V, typically 1000V, over durations of 1-100 usec, typically 5-10 usec at frequencies from 0-100 kHz, typically 1-10 kHz. The coaxial microwave applicator can be constructed to achieve cutoff condition directly in front of the material feed location for the secondary sputtering.

Figure 4H:
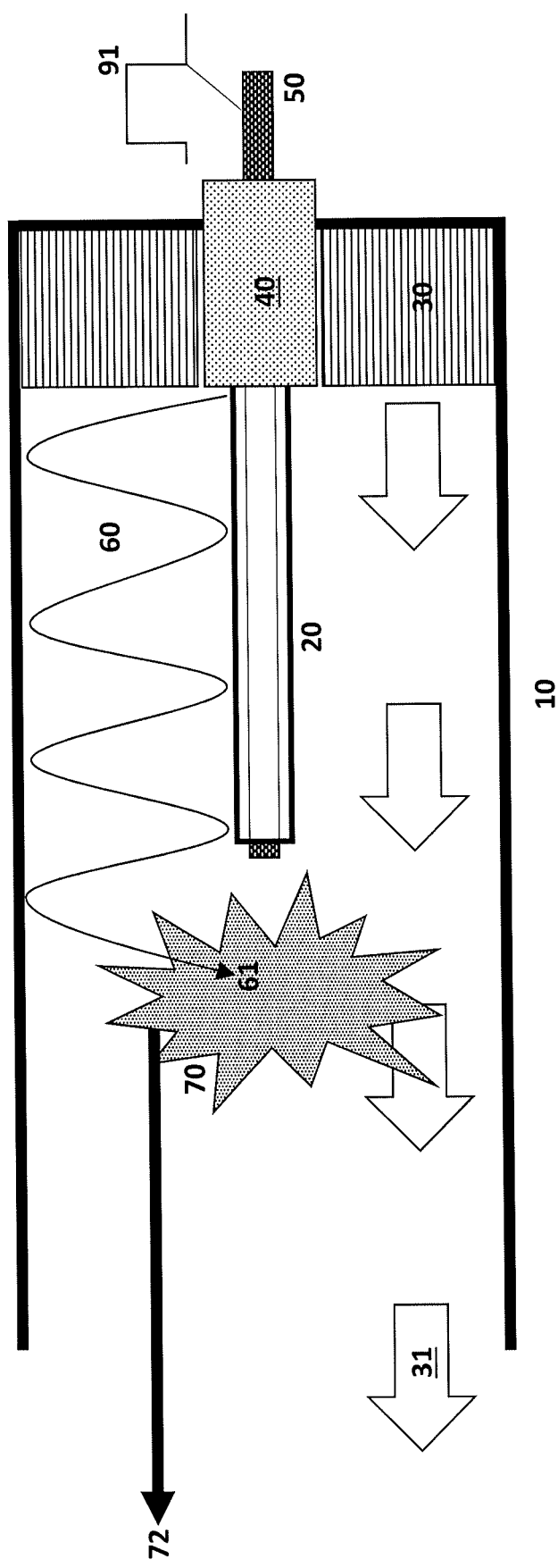
FIG. 4H depicts the application of a positive bias pulse (a.k.a. Kick Pulse) to elevate local plasma potential positive with respect to the substrate to supply ion energy to the substrate.

FIG. 4H depicts the application of a positive bias pulse at the second potential 91 (a.k.a. Kick Pulse) to elevate local plasma in the plasma generation zone 70 to a positive potential with respect to the substrate 8 to supply a directed ion flow/energy 72 to the substrate 8. A positive bias at the second potential 91 of 200V will raise the local plasma potential and allow the formation of a sheath drop across the substrate 8 and promote ion energy transfer to the substrate 8. This additional ion flux and energy will promote more vacuum-quality film growth while at atmospheric pressure. Note the positive pulsed bias is not required on the inner conductor electrode 20 region. An inserted ring or other electrode can elevate plasma potential and generate transient sheath drops around substrates.

The positive pulse bias gives some ion energy by bringing the plasma potential positive relative to the substrate to produce a transient sheath that grants eV energy to ions energy even with atmospheric collisions to enhance the film properties. The positive reversal is likewise short, intense and positive DC pulses are in the range of 0-2000V, typically 200V, over durations of 1-100 usec, typically 50 usec at similar operating frequencies with adjustable timing delay.

Figure 5:
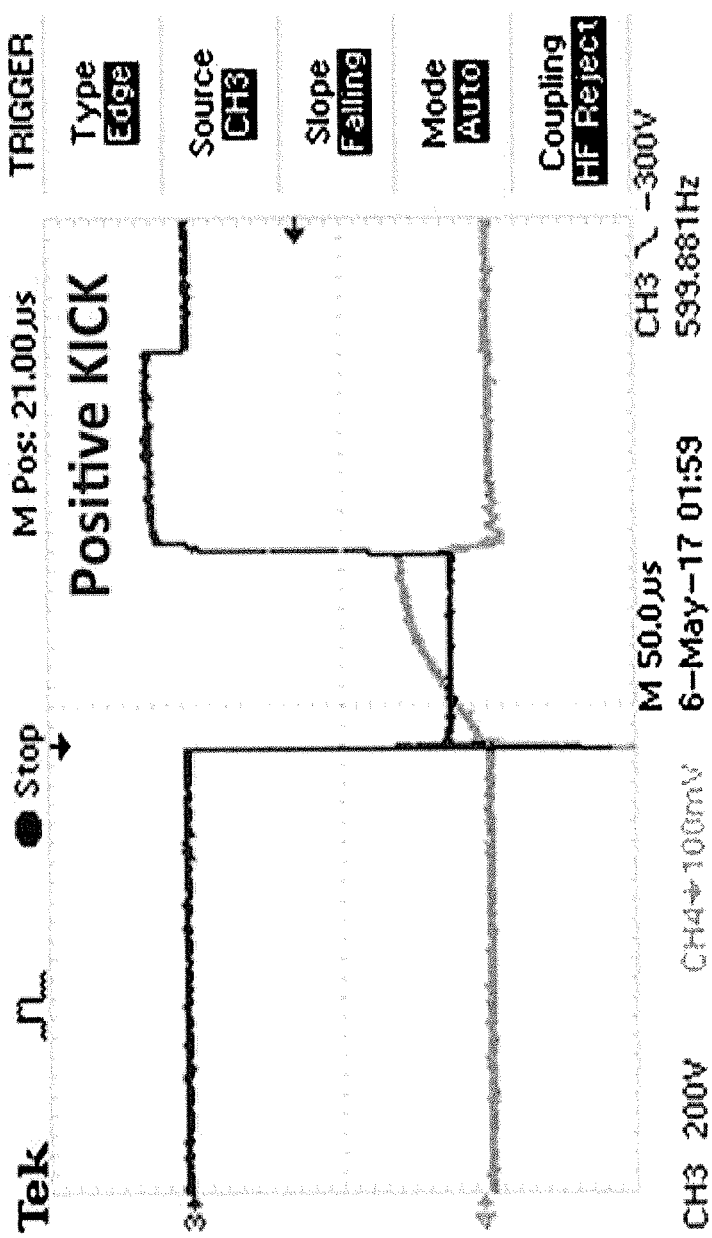
FIG. 5 is an illustrative waveform showing the application of a large negative sputtering pulse that is immediately followed by a positive kick pulse providing ions sufficient energy to interact with the substrate.

FIG. 5 is an illustrative waveform depiction showing the application of a large negative sputtering pulse at the first potential 90 that is immediately followed by a positive kick pulse at the second potential 91 to give ions energy to interact with the substrate 8. In FIG. 5, the current rise (green) shows sputtering current measured at ~100 A for a −700V negative pulse 90. The positive +100V pulse at the second potential 91 is commuted across the plasma generation zone 70 and the cold plasma jet 9 to the substrate 8. Dielectric material 5 on/near the coaxially arranged outer conductor electrode 10 and the inner conductor electrode 20 is important for this effect to be maximized without introducing sputtered material from unwanted locations.

Figure 6A:
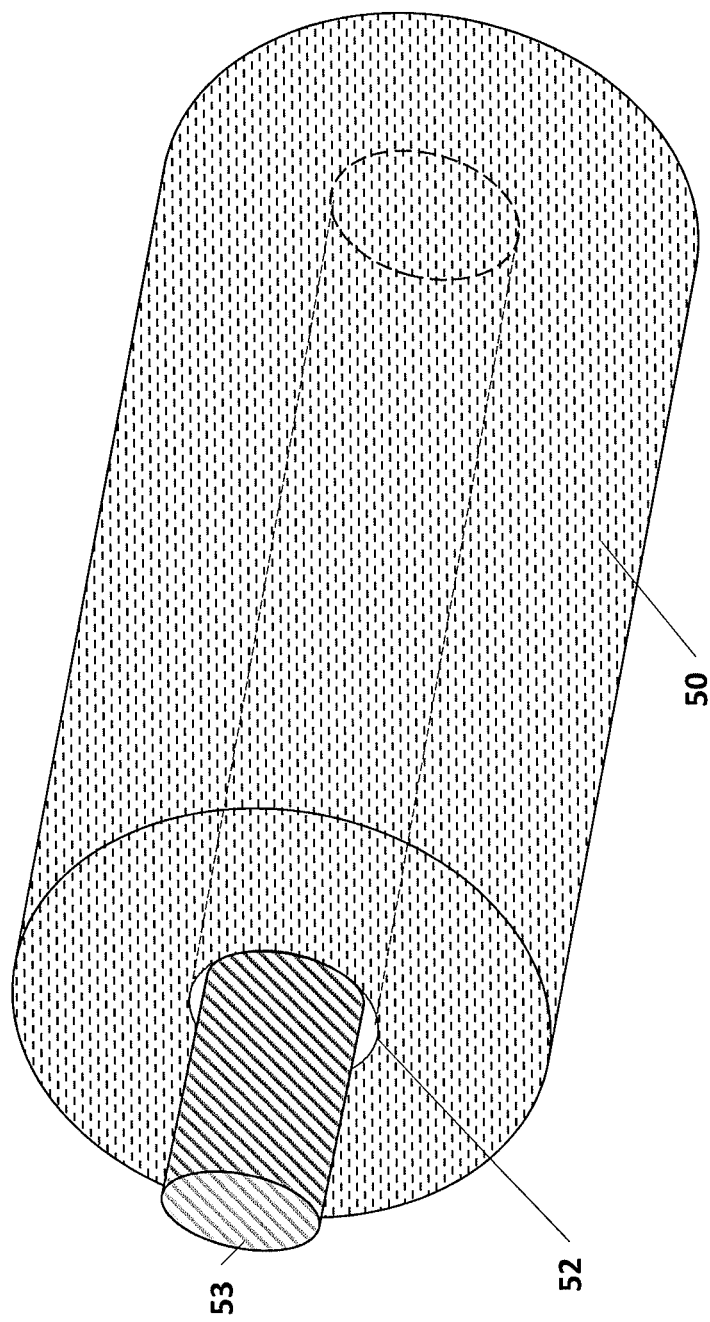
FIG. 6A depicts an insulating insert into central electrode in the microwave applicator housing a material feed.

FIG. 6A depicts the intermediary dielectric 50 inserted into the inner conductor electrode 20 in the microwave plasma applicator 1 housing at least one of an opening 52 for sputtering material of the feedstock 53. The insulating thickness of the intermediary dielectric 50 between the feedstock 53 (e.g., a sputtering electrode) and the inner conductor electrode 20 is important for dielectric standoff in both DC and transient for pulsing.

Figure 6B:
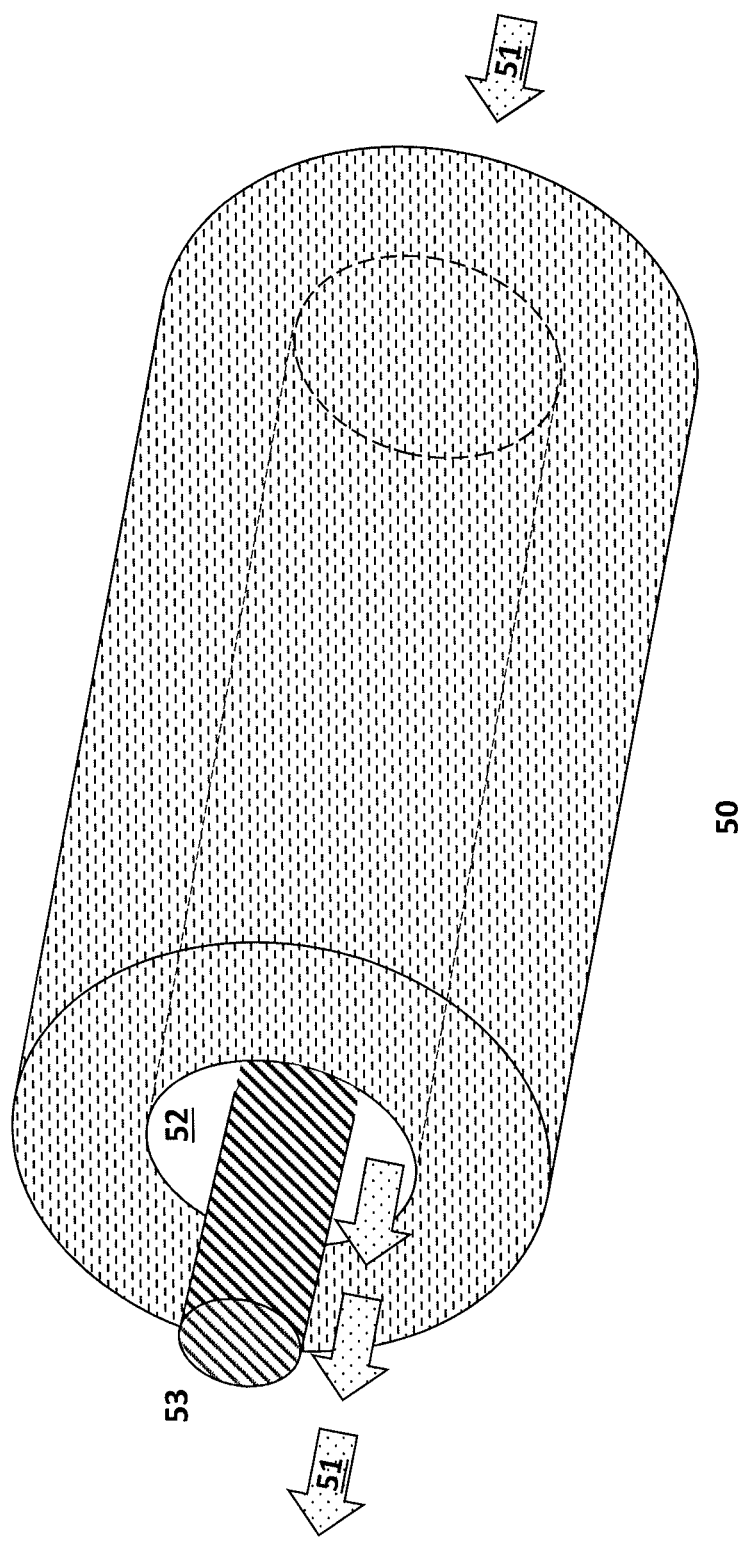
FIG. 6B depicts the insulating insert with large areal hole for both centerline gas flow and sputtering material.

FIG. 6B depicts the intermediary dielectric 50 with large areal hole 52 for both centerline flow 51 and sputtering material provided via the feedstock 53. This arrangement allows both sputtering atomization and entrainment with a carrier gas such as argon to prevent mixing with reactive oxygen radicals present from dissociation in the dense plasma generation region 70.

Figure 6C:
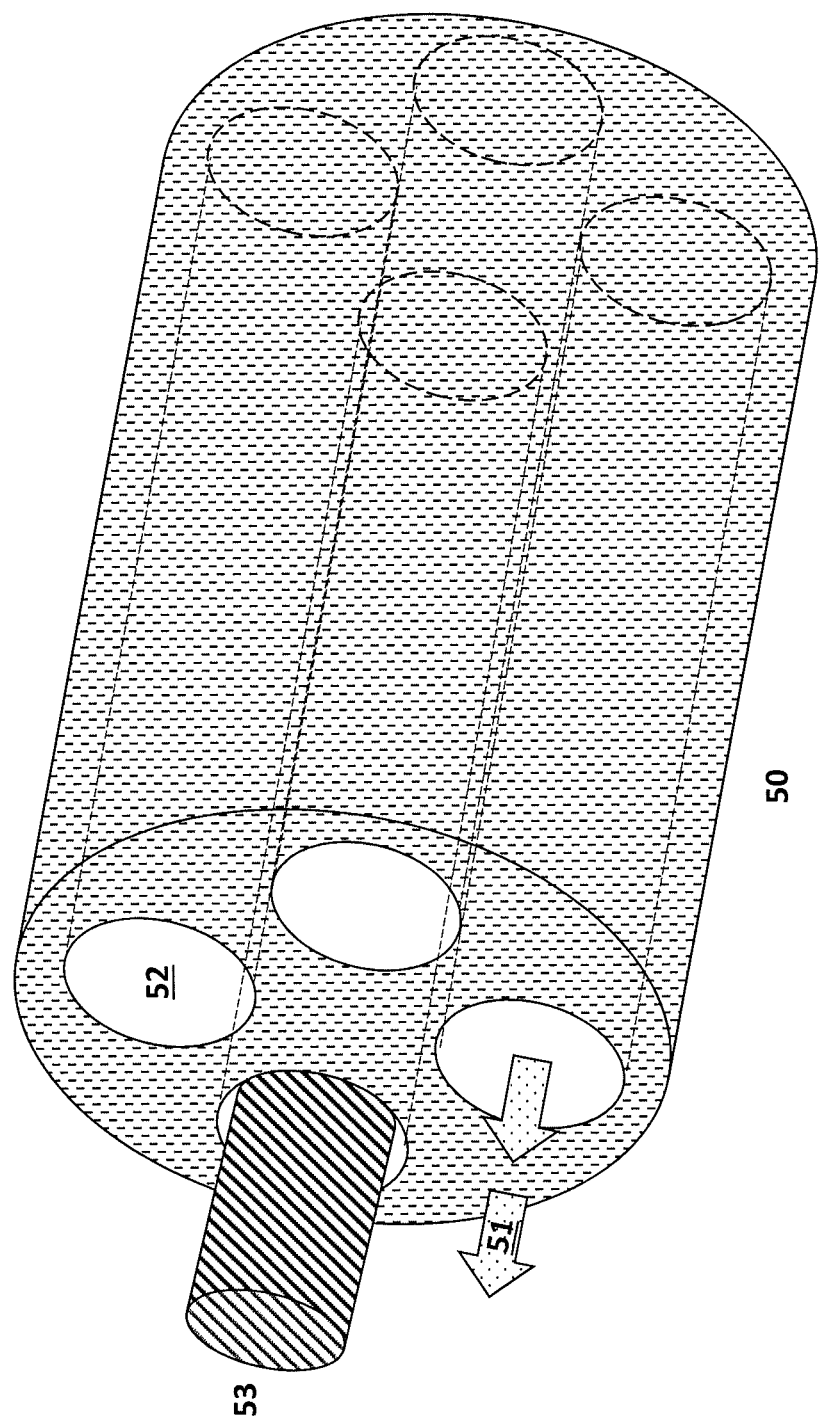
FIG. 6C depicts an example of a multi-mode insulating insert into the central electrode in the microwave applicator allowing a mix of gas introduction and sputtering feedstocks.

FIG. 6C depicts an example of a multi-mode form of the intermediary dielectric 50 inserted into the inner conductor electrode 20 in the microwave applicator 1 allowing a mix of gas introduction via the centerline flow 51 and sputtering feedstock materials via the feedstock 53. This setup is multifunctional allowing multiple sputtering sources to be used as well as gas flow structures. This illustration is not exhaustive as there are many possible configurations to achieve this result. Notable, in this arrangement, is the proximity to the independently generated microwave plasma of the plasma generation zone 70 that is incredibly dense and populous with ions 71 generated from the electric field of the high field region 61 by nature of the design.

Figure 7:
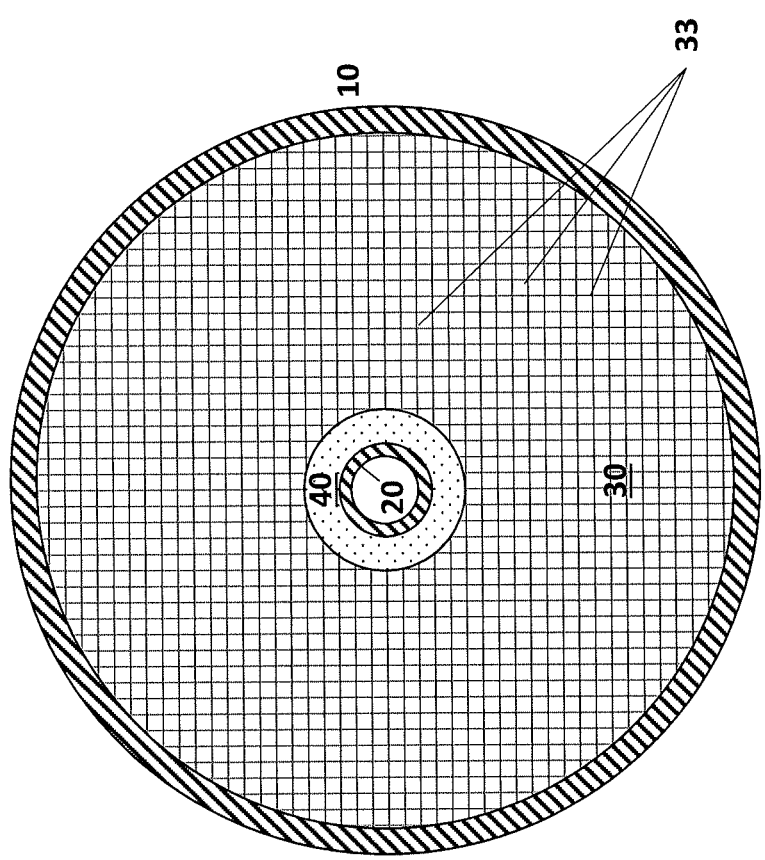
FIG. 7 depicts a cross-sectional view of one type of laminar flow gas manifold and distribution system consisting of N small diameter tubes in parallel configuration.

FIG. 7 depicts a cross-sectional view of an exemplary configuration of the zonal flow system 30 and distribution system where the zonal flow system comprises an array of small-diameter capillary tubes 33 in parallel configuration, where the squares represent the cross-sections of the capillary tubes 33. The number of squares does not necessarily represent the quantity of the capillary tubes 33. The number and diameter of the capillary tubes 33 will vary according to requirements of particular applications of the system described herein. The array of capillary tubes 33 is separated from the inner conductor electrode 20 and the outer conductor electrode 10 of the cavity resonator structure 4.

Figure 8:
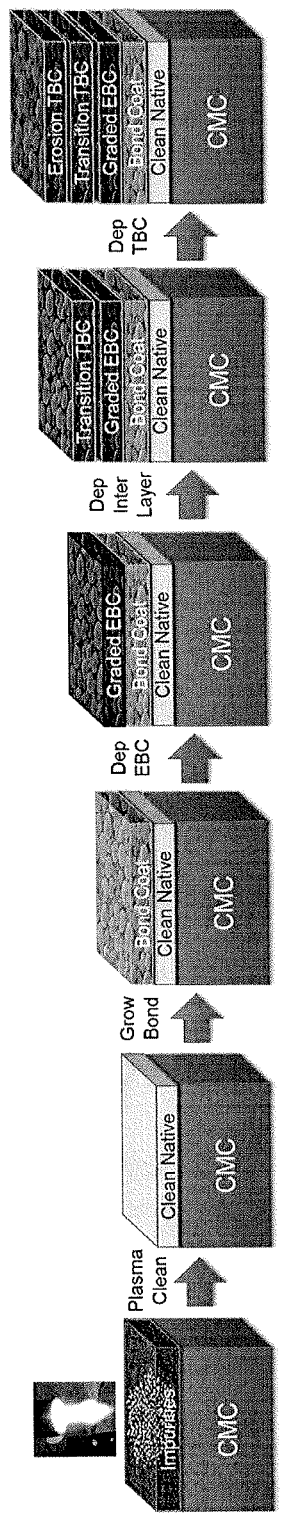
FIG. 8 is an illustration of steps for surface cleaning and hybrid thin-film deposition using the microwave plasma applicator using a mixture of precursor chemistries and sputtered materials for graded coatings and bonding.

FIG. 8 illustratively depicts steps for surface cleaning and hybrid thin-film deposition using the microwave plasma applicator and a mixture of precursor chemistries and sputtered materials for graded coatings and bonding. In the illustrative example, a ceramic matrix composite substrate is first cleaned by the cold plasma jet 9 (e.g. oxygen plasma jet) generated, for example, by flowing an $O_2$/Ar mix through the zonal flow system 30 into the plasma formation zone 70. Radicals, ions, and argon metastables are transported in the process/carrier gas flow 31 to the substrate 8 for surface chemical reduction and volatilization. A positive pulse bias at the second potential 91 may be used for additional ion etch energy to facilitate material removal from the substrate 8. After the cold plasma jet 9 cleaning, a chemical precursor material (e.g. hexamethyldisiloxane) is introduced into the centerline flow 51, that the precursor material is broken up into constituent parts in the plasma generation zone 70 and transported in the cold plasma jet 9 to the substrate 8 for deposition onto the thin-film coating 7. Additionally, reactive oxygen species bombard the substrate 8 and facilitate a reduction of $SiO_2$ which is incorporated into the thin film 7. Pulsed positive bias pulses at the second potential 91 serve to densify the film 7, provide additional energy flux to facilitate adhesion and film quality. After a period of time the process gas chemistry may be changed by introducing a second precursor gas in the centerline flow 51 though the intermediary dielectric 50 or via in the process/carrier gas flow 31. Admixtures of materials can occur in the thin-film coating 7 and compositionally grade the material for desired effect, including adding physical sputtering of materials for specific properties such as yttrium for stabilization of a zirconia. Additional material combinations can occur to grade the material to its desired properties and layering.

Expanding upon FIG. 8, the atmospheric cold plasma jet described herein enables formation, on the substrate 8, of material coatings and surface functionalization for corrosion protection, wear resistance and improved bonding strength. The approach is suitable for point-of-manufacturing material bonding to improve adhesive joint performance subject to harsh environmental exposure. The described system and method of operation addresses, in a cost-effective manner a need for a single, high-volume production process that meets the requirements of multi-material combinations relevant to the energy-intensive transportation industry (e.g. Al-steel, Mg-steel, Al—Mg and Al—CFRP joints for body-in-white structures) while eliminating off-line pretreatment for Al and Mg alloy substrates that are energy intensive, have chemical waste disposal issues, and add cost.

Cold plasma application of corrosion-resistant material coatings (e.g. silica-, silane-, alumina-, zirconia-based chemistries) for multi-material structures has the potential to vastly increase the optimized use of carbon fiber reinforced plastics (CFRP), aluminum, Al, magnesium, Mg, and steel alloys for multi-material automotive joints subject to harsh environmental factors, e.g. high-temperature salt water exposure for weeks, which further supports substantial mass reductions and significant improvements in vehicle fuel efficiency. Multi-material structures have complex (non-flat, deep, recessed, inverted) mating surfaces that are optimized for weight savings and decreased part count. The microwave plasma system described herein enables preparing and applying a coating to complex surfaces and shapes, i.e. a miniature plasma applicator with more than 2 cm reach that can be mounted on a multi-axis robot arm.

The ability to deposit functionally-graded coatings improves corrosion resistance and improves the adhesive bonding properties to enable advanced materials usage. The deposition process is described as plasma cleaning the surface with direct radical and plasma bombardment (pulsed positive bias enhanced), followed with an adhesion layer and main coating that is progressively layered and transitioned with additives, alternative chemistries or different reactive chemistries. For example, a bonding layer, followed with zirconia that is graded in transition to silica for greater CTE matchup over the thickness to tailor stress and composition. A wide range of chemistries are available with gas-phase precursors, e.g. hexamethyledisiloxane, tetraethyloxysilane, trimethylaluminum, tetrakis(dialkylamido)zirconium, etc.

Deposition of zirconium may be interspersed with yttrium for stabilization in a reactive oxygen plasma environment. Preservation of the yttrium electrode could be managed with inert gas flow on the centerline with reactive oxygen process gas for plasma formation. The flexibility of the miniature plasma jet applicator allows in-line manufacturing applications at significantly lower cost than conventional bath-type coating processes with flexibility for on-the-spot process adjustment and control. The plasma-based surface layer formation technology described herein has the potential to vastly increase the optimized use of advanced lightweight material for multi-material automotive "body-in-white" applications, resulting in substantial mass reduction and significant improvement in vehicle fuel efficiency while eliminating wet chemical steps.

Another application of the plasma-based material layer formation technology described herein is the deposition of diamond-like carbon for impact protection, wear resistance and low coefficient of friction. Diamond-like carbon (DLC) is typically formed when ionized and decomposed carbon or hydrocarbon species land on a substrate surface. DLC films have a range of surface properties that make them ideal candidates for abrasion and wear resistance with high hardness, chemical inertness for tough environmental conditions, and low coefficient of friction for minimal sliding contact resistance. In addition to excellent tribological properties, DLC films also offer superior optical and electrical properties including excellent dielectric strength.

Amorphous DLC films are typically deposited at substrate temperatures less than 300° C. and consist of a mixture of sp2 (graphite) & sp3 (diamond) phases without a dominant crystalline lattice structure. DLC can be sorted into three categories: tetrahedral carbon (ta-C), hydrogenated amorphous carbon (a-C:H), and hydrogenated amorphous carbon with metal (a-C:H+Me). The tetrahedral form (ta-C) has extremely high hardness (>4000 HV) and low coefficient of friction (<0.1) with minimal appreciable hydrogen content and large percentage >80% sp3 bonds. Whereas the hydrogenated form (a-C:H) can be nearly 50% hydrogen by number with <60% sp3 bonds resulting in medium hardness (1500-3000 HV) and higher coefficient of friction >0.20. Metal impregnated films add dimensional tolerance, stress relief and substrate integration properties at a further loss of DLC properties.

The ta-C film structure is the superior choice for functional material coating; however, it is the most difficult to achieve. Multiple methods have been developed over the past ten years to deposit DLC coatings, i.e. ion beam deposition, high-power pulsed magnetron sputtering, plasma-enhanced chemical vapor deposition, pulsed laser ablation and dielectric-barrier discharge coating. These low-pressure vacuum chamber processes have had the most success since the exact geometry, material and environmental conditions can be fixed. Starfire Industries IMPULSE pulsed power module with the positive-bias kick pulse has been shown to generate sp3 fractions >70% and atomically smooth surfaces with 0.1 nm roughness and near-zero hydrogen content for <0.1 coefficient of friction.

The traditional limitation in film thickness due to buildup of internal compressive stress in the coating leading to delaminating risk can be overcome with pulsed deposition. Traditional stress relief through thermal annealing is complicated by the fact that temperatures above 300° C. accelerate conversion of diamond (sp3) into graphitic (sp2) form. Higher thicknesses can be achieved with metal addition (via precursor or sputter delivery) and/or pulsed thermal surface treatment to relax the compressive stress, e.g. positive kick biasing. The atmospheric cold plasma jet described herein avoids such bulk temperatures.

Where vacuum plasma processes have an advantage is in the control of the: (1) ion flux density at the substrate surface to encourage sp3 bond formation, (2) ion bombarding energy for lattice densification and sp2 bond breaking, and (3) thermal temperature distributions on the surface for stress annealing and/or CHx detachment. These factors allow tailoring the energy and matter input to the surface for formation of ta-C films. In invention described herein enables these processing properties integrated into a non-thermal plasma deposition system. Because the plasma is electrically floating, this process can be exploited without degradation of electrodes using unipolar positive pulses and ions are accelerated into the part.

Non-thermal plasma allows chemistry and reactions to occur at high rates without high-temperature throughout the work piece so it is safe to use on high-grade alloys and superalloys where a high-temperature would affect the bulk structure and cause a change. Atmospheric pressure operation means DLC coating performed in a glovebox environment, i.e. less capital expense without vacuum hardware. The coating could be applied to 3D-shaped parts through simple manipulation. A wide range of gas-phase chemistries can be used for DLC deposition process with inexpensive and commonly available feedstock materials, e.g. methane, acetylene, helium, argon, etc. Direct physical sputtering of high-purity carbon feedstock into the flowstream is an enabler for at-C.

Figure 9:
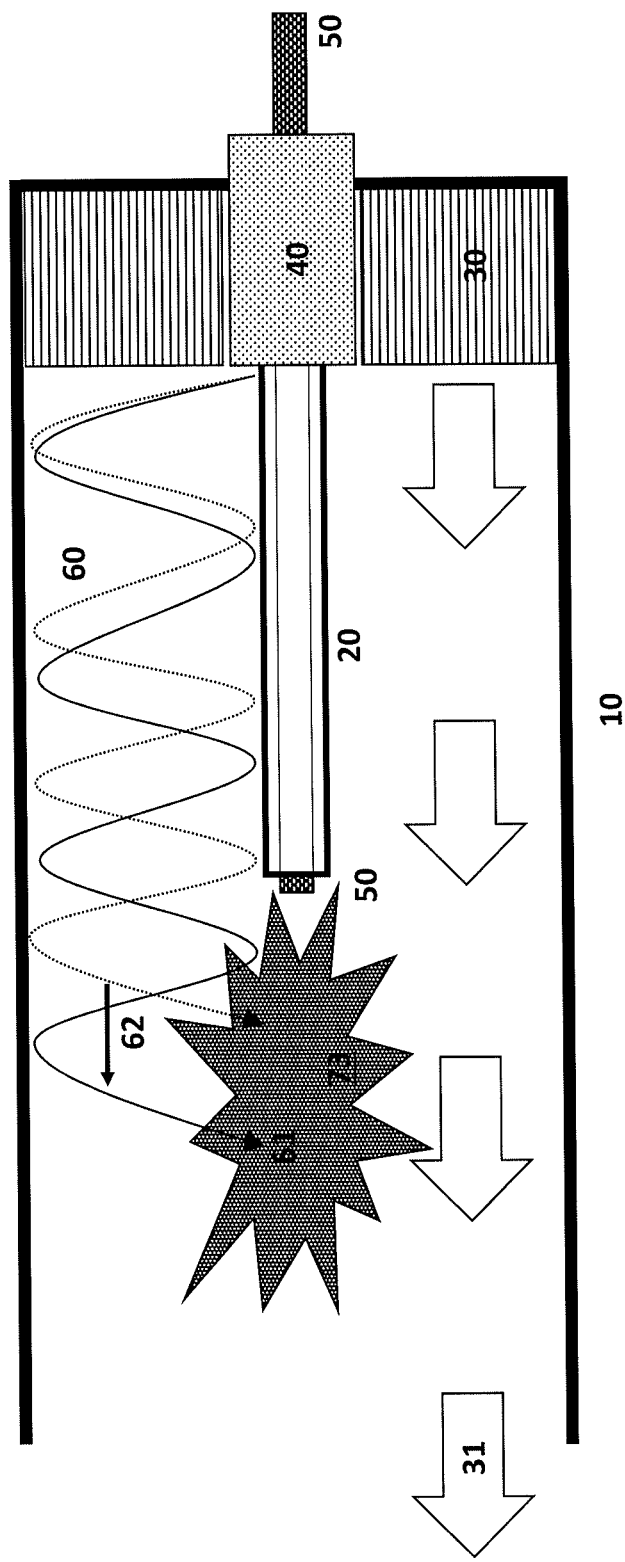
FIG. 9 is an illustration of frequency tuning for impedance matching under variable conductivity plasma loads.

FIG. 9 is an illustration of frequency tuning for impedance matching under variable conductivity plasma loads. The plasma and the resultant cold plasma jet 9 is a conductive material that will act like a lossy pseudo-electrode for the propagation and reflection of electromagnetic energy 60 provided the critical density is above the threshold criterion; e.g. for 2.45 GHz it is 7.5e10 electrons/cm3. The presence of an intense plasma pseudo-electrode 73 will partially counteract the cutoff condition of the cavity resonator structure 4 and allow the electromagnetic energy 60 to propagate further into the microwave plasma applicator 1. This is desirable for higher power plasma generation and facilitating formation of the cold plasma jet 9. However, the effective impedance of the cavity resonator structure 4 will change with the presence of the intense pseudo-electrode plasma 73 which necessitates a change in operational frequency for load matching for highest power transfer efficiency. In this example sensing circuitry within the control electronics 102 located in the microwave generator 2 detects an impedance shift and the control electronics 102 adjusts a voltage-controlled oscillator and low-power driver hardware within the impedance measurement and microwave frequency control 101 to adjust frequency of power fed into the solid-state power amplifier 100 to generate a new microwave power signal 62 that is shifted from the non-plasma or non-loaded case. The impedance can be matched with frequency adjustments to account for changes in the plasma load, temperature, gas flow rate, proximity to substrate and power levels, including pulsed microwave deposition. This aspect of the described exemplary system and method of operation also allows for less precision in manufacturing the microwave plasma applicator 1 to lower cost of fabricating the system.

Figure 10:
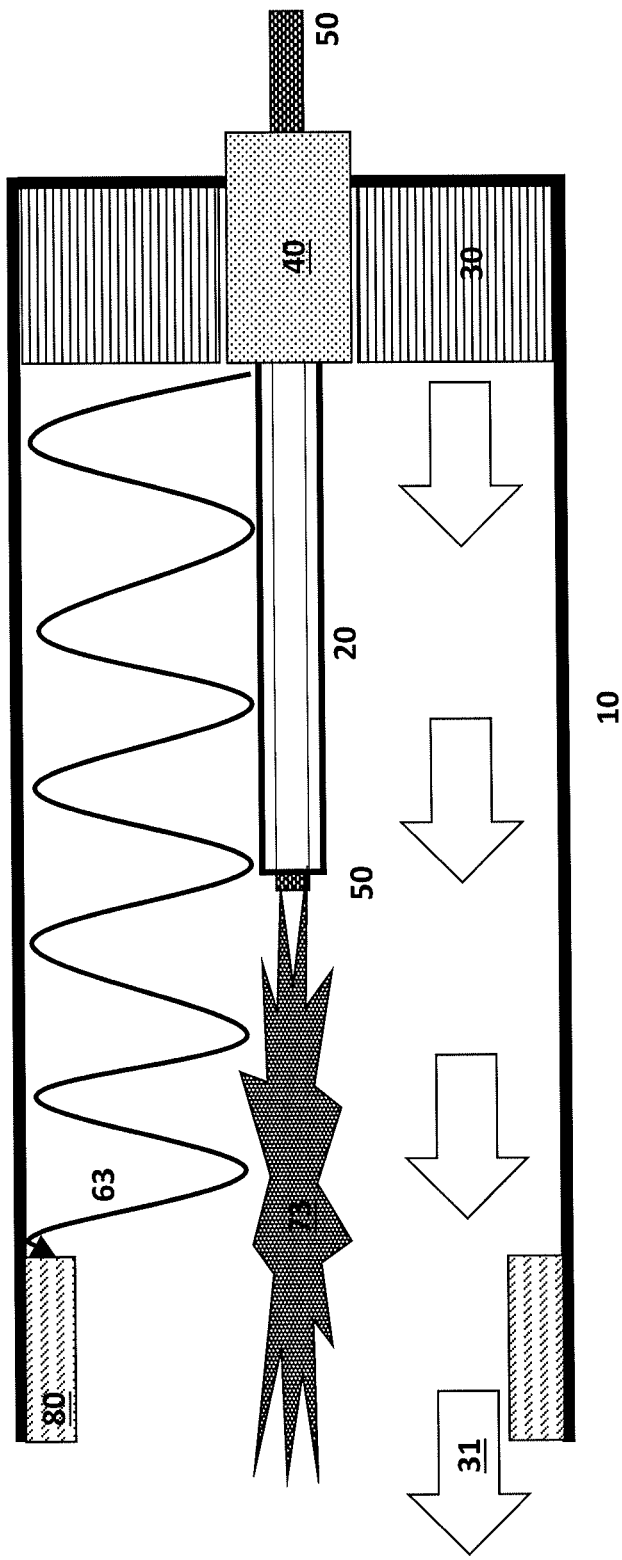
FIG. 10 depicts a cross-sectional view of microwave absorber material located near the coaxial applicator exit to minimize or prevent electromagnetic energy leakage.

Turning to FIG. 10, a side cross-sectional view is depicted of a microwave absorber material 80 located near an exit point of the microwave plasma applicator 1 to minimize or prevent leakage of an electromagnetic energy 63. Under extreme power conditions with very high plasma density, the pseudo electrode 73 can extend to the exit point of the microwave plasma applicator 1 and allow radiation of microwave energy into the ambient. This is an unsafe condition that can be mitigated by providing the microwave absorber material 80 along the rim of the outer conductor electrode 10 to inhibit microwave energy propagation beyond the microwave plasma applicator 1. This is a balance between microwave plasma generation and self-shielding.

Figure 11A:
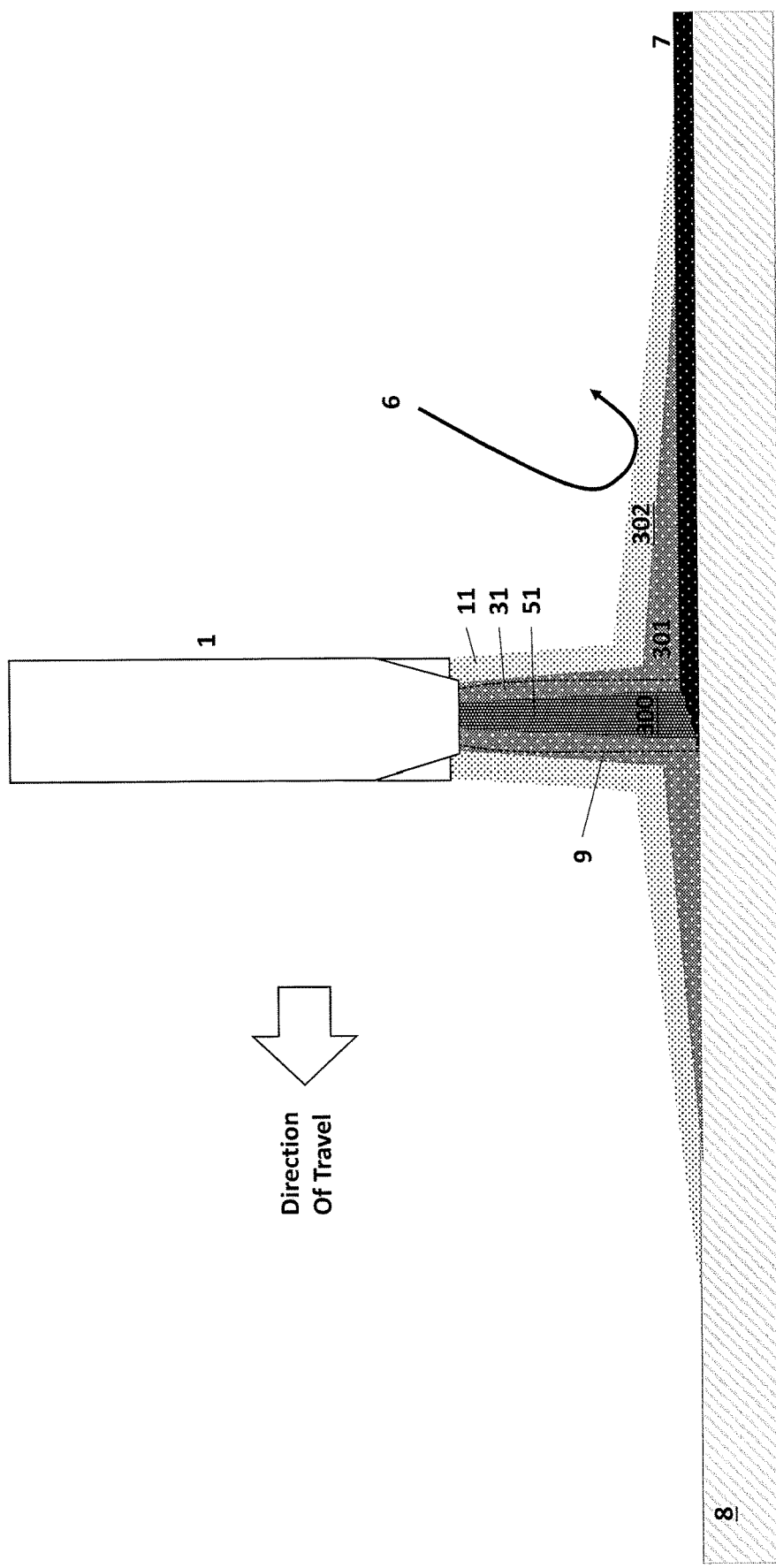
FIG. 11A is a side profile illustration depicting the operation of the cold-plasma jet and deposition system traveling across a substrate to be treated.

FIG. 11A illustratively depicts the various flow regions associated with the microwave plasma applicator 1 in operation with the cold plasma jet 9 impinging on the surface of the substrate 8 that is in relative motion. Three gas flow regions (i.e. flows 11, 31, 51) are shown delineating each zone onto the substrate. The outer shield gas flow 11 provides a shield at the zone 302 that prevents contaminant materials 6 from outside entraining into the process region of the zones 301 and 300. The shield gas may also blow surface dust and debris away from the surface of the substrate 8 prior to the cold plasma jet 9 reaching that location as the relative motion occurs between the microwave plasma applicator 1 and the substrate 8. The cold plasma jet 9 will generate the active species, e.g. ions, electrons, radicals, atoms, molecules, etc., that will impinge onto the surface of the substrate 8 and the envelope of the plasma jet 9 extends through the centerline flow 51 and some/all (depending on power, flow, geometry and other variables) of the process/carrier gas flow 31. The process/carrier gas flow 31 that is activated by the cold plasma jet 9 will impinge on the surface of the substrate 8 in a cleaning or activation region indicated by the zone 301 in advance of the direct thin-film deposition 7 carried out within the portion of the substrate 8 surface subject to the zone 300. Thus, in an exemplary embodiment, the thin-film deposition 7 occurs in zone 300 from the plasma jet action on the centerline flow 51. A plasma-activated region, indicated by the zone 301 trailing the passage of the deposition region indicated by the zone 300 can serve for additional reactive chemistry and thin-film functionalization.

Figure 11B:
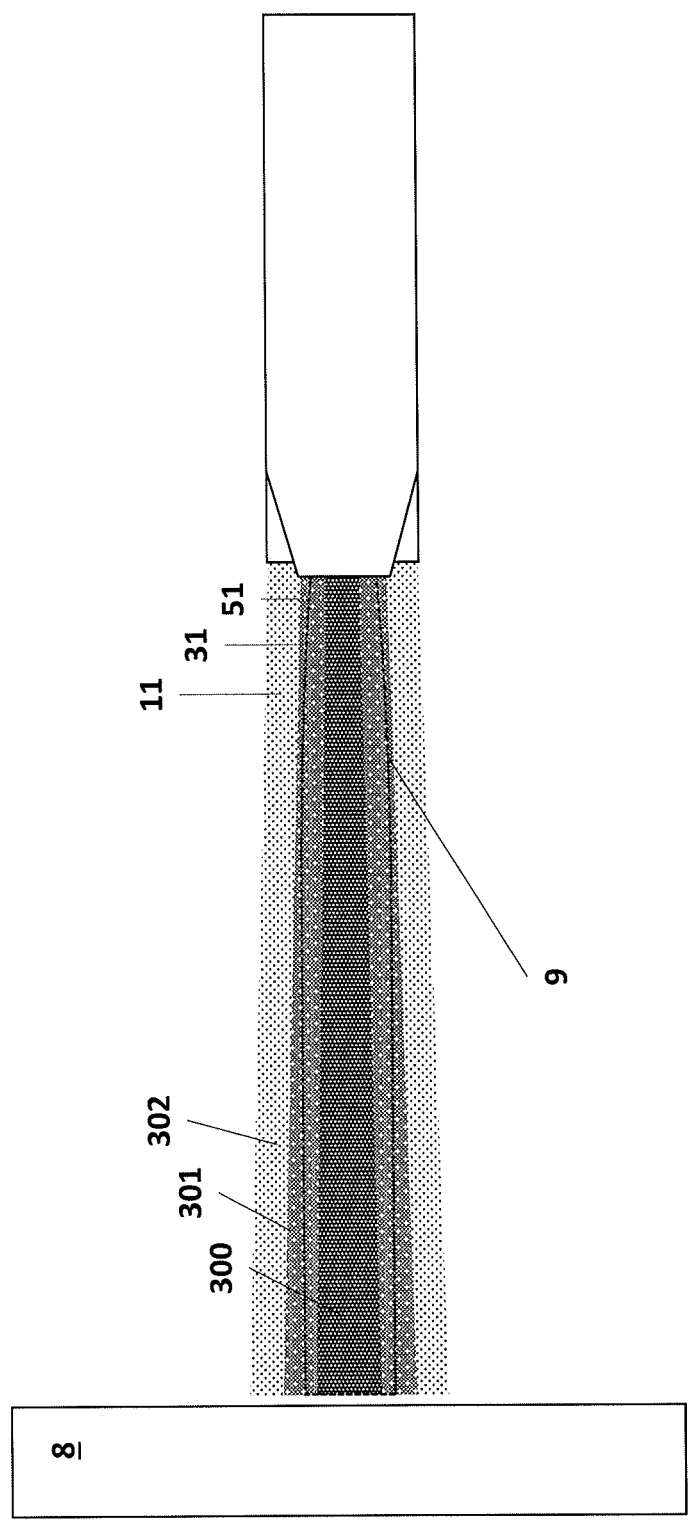
FIG. 11B is an illustration showing the zonal gas flow through the plasma formation region leading to distinct, individual plasma chemistry, radical and ion regimes at the substrate.

FIG. 11B shows a similar side cross-sectional view as FIG. 11A which highlights the zonal flow contained in and around the cold plasma jet 9 prior to impingement on a surface of the substrate 8.

Figure 11C:
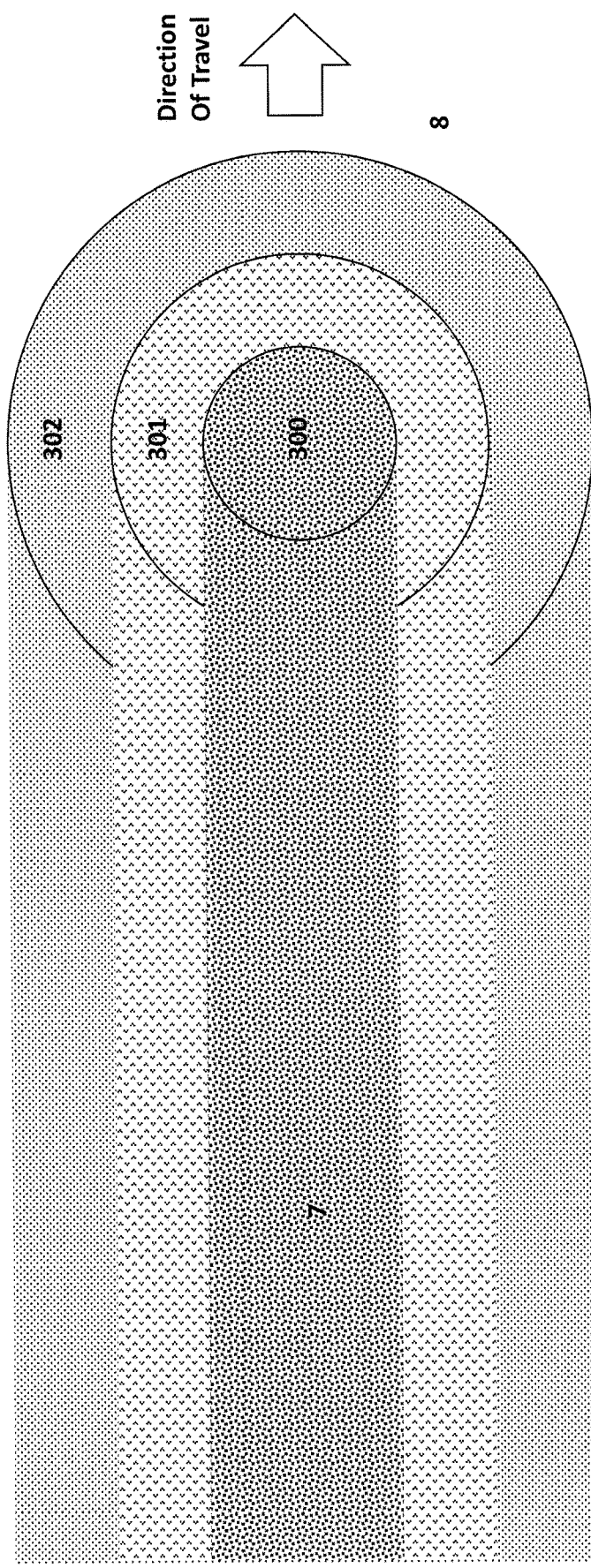
FIG. 11C is a top down view of the distinct, individual plasma chemistry and gas flow regions impinging on the substrate for isolation of external contaminants, localized plasma cleaning and reactive chemistry, and precursor/sputter material coating zones while plasma jet is traveling.

FIG. 11C further highlights/depicts the regions of the various zonal flows described herein by providing a plan view of the substrate 8 impacted by the various flows (i.e. flows 11, 31 and 51) on the substrate 8 for a coaxial embodiment of the cavity resonator structure of the microwave plasma applicator 1. The various zones indicated in FIG. 11C show the shield gas exclusion and protection region in the zone 302, then a process/carrier gas plasma activated region in the zone 301, e.g. $O_2$ plasma, and a centerline thin-film deposition region in the zone 300. As the plasma jet 9 travels relative to the surface of the substrate 8, the cold plasma jet leaves the thin-film 7 behind in the region indicated by the zone 300—after debris removal and contaminant shielding 302 and surface cleaning and activation in the zone 301. For example, trimethylaluminum and argon may be introduced in the centerline flow 51, an oxygen process gas may be injected into the process/carrier gas flow 31 and argon shield gas may be used in the outer shield gas flow 11. The debris is cleared, the oxygen radicals and ions clean the substrate, and aluminum is deposited that is subsequently reacted with oxygen for alumina coating.

FIG. 12 shows an alternative embodiment in a planar applicator configuration of the microwave plasma applicator 1 for microwave cold-plasma treatment and deposition on sheets or large area versions of the substrate 8. Similar to earlier figures, the cold plasma jet 9 is superimposed on a zonal flow field across a width of the substrate 8. The planar flows are serially drawn over the surface of the substrate 8 such that after initial treating carried out by the outer shield gas flow 11, the system serially applies the cold plasma jet 9 within the process/carrier gas flow 31 and the centerline flow 51. The flows at the point of encountering the substrate 8 surface operate similarly to the previously described flows associated with the shield gas protection at the zone 302, the cleaning and processing by the process/carrier gas flow at the zone 301 and the thin-film deposition achieved at the zone 300.

Figure 13:
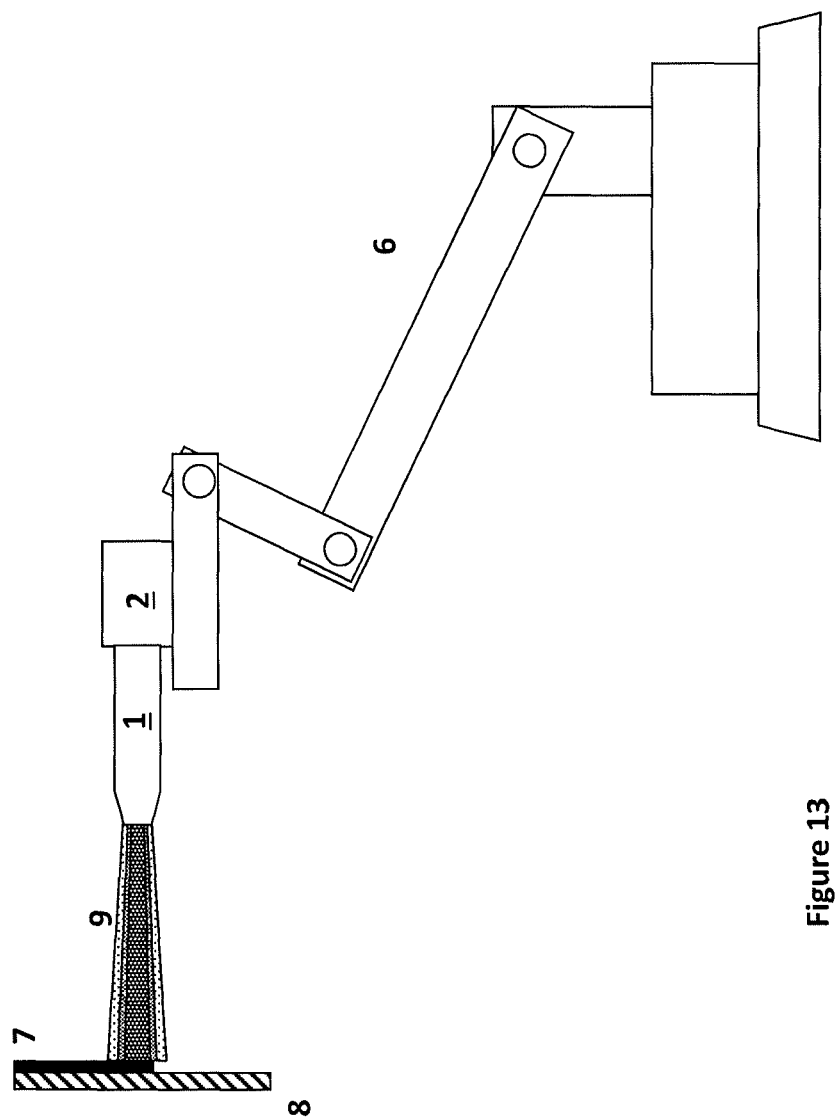
FIG. 13 is an illustration of the cold-plasma jet applicator and generator integrated onto a robotic arm for local materials treatment for in-line manufacturing.

FIG. 13 shows an illustration of one embodiment showing the microwave (cold) plasma applicator 1 and microwave generator 2 integrated onto a multi-axis robot arm 6 for extended treatment of substrate 8 by the cold plasma jet 9 generating the thin-film coating 7. In this embodiment the lightweight, small, and closely integrated attributes of the exemplary system is apparent for achieving low-cost integration with in-line production hardware.

It can thus be seen that a new and useful system for generating atmospheric-pressure plasmas for hybrid thin-film deposition and surface modification has been described. In view of the many possible embodiments to which the principles of this invention may be applied, it should be recognized that the examples described herein with respect to the drawing figures are meant to be illustrative only and should not be taken as limiting the scope of invention. For example, those of skill in the art will recognize that the elements of the illustrative examples depicted in functional blocks and depicted structures may be implemented in a wide variety of electronic circuitry and physical structures as would be understood by those skilled in the art. Thus, the illustrative examples can be modified in arrangement and detail without departing from the spirit of the invention. Therefore, the invention as described herein contemplates all such embodiments as may come within the scope of the following claims and equivalents thereof.

What is claimed is:

1. A system for depositing a material onto a receiving surface, where the material is formed by use of a plasma to modify a source material in-transit to the receiving surface, the system comprising:
   a microwave generator electronics stage;
   a microwave applicator stage including a cavity resonator structure, wherein the cavity resonator structure comprises:
   an outer conductor,
   an inner conductor, and
   a resonator cavity interposed between the outer conductor and the inner conductor; and
   a multi-component flow assembly comprising:
   a laminar flow nozzle providing a shield gas,
   a zonal flow nozzle providing a functional process gas, and
   a source material flow source configured to provide a flow of the source material;
   wherein the source material flow source and zonal flow nozzle are physically configured to facilitate a reaction between the flow of the source material emitted from the source material flow source and the functional process gas within a plasma region generated by the microwave generator electronics stage and the microwave applicator stage, wherein the plasma region comprises a plasma generation zone, wherein the plasma region is between an emission position of the source material flow source and the receiving surface, wherein the laminar flow nozzle is configured to flow the shield gas, from at least one outlet positioned flow-wise between the plasma generation zone and the receiving surface, so as to effectively isolate, from external contaminants, the functional process gas and the flow of the source material in the plasma region, and wherein the outer conductor extends beyond the inner conductor to create a high electric field region at a cutoff location located within the cavity resonator structure, thereby enabling generating, at the plasma generation zone, a plasma proximal to an injection point of the source material, and thereby facilitating consumption of the source material.

2. The system of claim 1 wherein the laminar flow nozzle is configured to emit the shield gas in a cross-sectional pattern forming a perimeter around the functional process gas expelled from the zonal flow nozzle.

3. The system of claim 2 wherein the zonal flow nozzle is configured to emit the functional process gas in a cross-sectional pattern forming a perimeter around the source material expelled from the source material flow source.

4. The system of claim 3 wherein the source material flow source has a circular cross-section outlet, the zonal flow nozzle has a ring-shaped cross-section outlet concentric with the circular cross-section outlet, and the laminar flow nozzle has a ring-shaped cross-section outlet concentric with the circular cross-section outlet.

5. The system of claim 1 wherein the laminar flow nozzle, zonal flow nozzle and the source material flow source are each configured with gas flow outlets that are generally linear; and wherein the zonal flow nozzle comprises at least two linear functional process gas flow outlets positioned to expel the functional process gas at opposite sides of the source material flow source.

6. The system of claim 5 wherein the laminar flow nozzle comprises at least two linear shield gas flow outlets positioned to expel the shield gas outside the at least two linear functional process gas flow outlets.

7. The system of claim 1 wherein the zonal flow nozzle comprises bundled capillary tubes that receive the functional process gas from a functional process gas plenum.

8. The system of claim 1 wherein the cavity resonator structure operates in a cutoff mode to generate a high electric field for generating, at the plasma generation zone, a plasma proximal to a precursor injection point, thereby supplying ions that facilitate direct pulsed sputtering of material off a feedstock electrode.

9. The system of claim 1 wherein the cavity resonator structure is configured to generate a cold plasma jet while operating in a frequency of 500 MHz to 2.5 GHz.

10. The system of claim 1 wherein an insulating material is interposed between the outer conductor and the inner conductor, wherein the insulating material facilitates active biasing, thereby facilitating sputtering using a feedstock and/or elevating an electrical potential of ions within the plasma region.

11. The system of claim 1 wherein the microwave generator electronics operate in a continuous wave mode of operation to drive the cavity resonator structure.

12. The system of claim 1 wherein the microwave generator electronics operate in a pulsed mode of operation to drive the cavity resonator structure.

13. The system of claim 1 wherein the microwave generator electronics comprise solid-state amplifiers that support frequency tuning that facilitates impedance matching during operation to maintain a desired plasma load.

14. The system of claim 1 wherein a pulsed positive bias is applied to the plasma region provide ion energy to the process/carrier gas flow substrate to facilitate the treating of the receiving surface.

15. The system of claim 1 wherein a pulsed negative bias is applied to the source material flow source to achieve sputtering of source material.

16. The system of claim 1 wherein the shield gas flow forms an isolation barrier between outside contaminants and the plasma region.

17. The system of claim 1 wherein the functional process gas after passing through the plasma region cleans and functionalizes the receiving surface.

18. The system of claim 1 wherein the functional process gas, after passing through the plasma region, generates reactive species that alter a composition of the receiving surface.

19. The system of claim 1 wherein the particles of source material, after passing through the plasma region, are incorporated onto the receiving surface.

* * * * *